(12) United States Patent
Jin et al.

(10) Patent No.: US 9,108,880 B2
(45) Date of Patent: Aug. 18, 2015

(54) NANOSTRUCTURED SUPERHYDROPHOBIC, SUPEROLEOPHOBIC AND/OR SUPEROMNIPHOBIC COATINGS, METHODS FOR FABRICATION, AND APPLICATIONS THEREOF

(75) Inventors: Sungho Jin, San Diego, CA (US);
Jin-Yeol Kim, Seoul (KR); Kunbae Noh, San Diego, CA (US); Chulmin Choi, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 1042 days.

(21) Appl. No.: 13/059,966

(22) PCT Filed: Aug. 18, 2009

(86) PCT No.: PCT/US2009/054235
§ 371 (c)(1),
(2), (4) Date: Jun. 8, 2011

(87) PCT Pub. No.: WO2010/022107
PCT Pub. Date: Feb. 25, 2010

(65) Prior Publication Data
US 2011/0229667 A1    Sep. 22, 2011

Related U.S. Application Data

(60) Provisional application No. 61/089,847, filed on Aug. 18, 2008.

(51) Int. Cl.
*C23F 1/00* (2006.01)
*C03C 15/00* (2006.01)
(Continued)

(52) U.S. Cl.
CPC ............ *C03C 15/00* (2013.01); *B81C 1/00031* (2013.01); *B81C 1/00206* (2013.01);
(Continued)

(58) Field of Classification Search
CPC ........................ B81C 1/00206; B81C 1/00031
USPC .......................................... 216/2, 8, 9, 11, 80
See application file for complete search history.

(56) References Cited

U.S. PATENT DOCUMENTS 7,258,731 B2    8/2007    D'Urso et al.
7,531,120 B2    5/2009    Van Rijn et al.
(Continued)

FOREIGN PATENT DOCUMENTS

WO    02/49980    6/2002
WO    2007/054649    5/2007
(Continued)

OTHER PUBLICATIONS

Choi, C., et al., "Strongly Superhydrophobic Silicon Nanowires by Supercritical CO2 Drying," Electronic Materials Letters, 6(2):59-64, Jun. 2010.
(Continued)

*Primary Examiner* — Binh X Tran
(74) *Attorney, Agent, or Firm* — Perkins Coie LLP

(57) ABSTRACT

Systems, techniques and applications for nanoscale coating structures and materials that are superhydrophobic with a water contact angle greater than about 140° or 160° and/or superoleophobic with an oil contact angle greater than about 140° or 160°. The nanostructured coatings can include Si or metallic, ceramic or polymeric nanowires that may have a re-entrant or mushroom-like tip geometry. The nanowired coatings can be used in various self-cleaning applications ranging from glass windows for high-rise buildings and non-wash automobiles to pipeline inner surface coatings and surface coatings for biomedical implants.

16 Claims, 26 Drawing Sheets

(51) Int. Cl.
  *B81C 1/00* (2006.01)
  *C09D 1/00* (2006.01)
  *C09D 5/16* (2006.01)
  *C09D 5/28* (2006.01)
  *B05D 5/08* (2006.01)

(52) U.S. Cl.
  CPC . *C09D 1/00* (2013.01); *C09D 5/16* (2013.01); *C09D 5/28* (2013.01); *B05D 5/08* (2013.01); *C03C 2217/76* (2013.01); *Y10T 428/13* (2015.01); *Y10T 428/24355* (2015.01)

(56) References Cited

U.S. PATENT DOCUMENTS

| | | | |
|---|---|---|---|
| 2005/0181195 | A1 | 8/2005 | Dubrow |
| 2006/0024504 | A1 | 2/2006 | Nelson et al. |
| 2006/0024508 | A1* | 2/2006 | D'Urso et al. ............... 428/426 |
| 2006/0029808 | A1 | 2/2006 | Zhai et al. |
| 2006/0128239 | A1 | 6/2006 | Nun et al. |
| 2007/0026193 | A1 | 2/2007 | Luzinov et al. |
| 2007/0148815 | A1 | 6/2007 | Chao et al. |
| 2007/0184247 | A1 | 8/2007 | Simpson et al. |
| 2007/0231542 | A1* | 10/2007 | Deng et al. ............... 428/141 |
| 2008/0199657 | A1 | 8/2008 | Capron et al. |
| 2009/0324308 | A1* | 12/2009 | Law et al. ............... 399/333 |
| 2010/0038342 | A1* | 2/2010 | Lim et al. ............... 216/41 |
| 2010/0055397 | A1* | 3/2010 | Kurihara et al. ............ 428/141 |
| 2010/0206367 | A1 | 8/2010 | Jeong et al. |

FOREIGN PATENT DOCUMENTS

| | | |
|---|---|---|
| WO | 2007/102960 | 9/2007 |
| WO | 2007/126432 | 11/2007 |
| WO | 2007/128965 A1 | 11/2007 |
| WO | 2012/087352 A2 | 6/2012 |

OTHER PUBLICATIONS

International Search Report and Written Opinion mailed on Nov. 29, 2012 for International Application No. PCT/US2011/001995, filed Dec. 20, 2011 (10 pages).

Kim, J.-Y., et al., "Optically Transparent Glass with Vertically Aligned Surface Al2O3 Nanowires Having Superhydrophobic Characteristics," NANO: Brief Reports and Reviews, 5(2):89-95, Apr. 2010.

Blossey, R., "Self-Cleaning Surfaces—Virtual Realities," Nature Materials, 2(5):301-306, May 2003.

Byun, S.H., International Search Report and Written Opinion mailed on Apr. 8, 2010 for International Application No. PCT/US2009/054235, filed Aug. 18, 2009 (13 pages).

Cassie, A.B.D., et al., "Wettability of Porous Surfaces," Transactions of the Faraday Society, 40:546-551, Jan. 1944.

Coulson, S.R., et al., "Super-Repellent Composite Fluoropolymer Surfaces," The Journal of Physical Chemistry B, 104(37):8836-8840, Aug. 2000.

Gapin, A.I., et al., "CoPt patterned media in anodized aluminum oxide templates," Journal of Applied Physics, 99 (8):08G902(1-3), Apr. 2006.

Parkin, I.P., et al., "Self-Cleaning Coatings," Journal of Materials Chemistry, 15(17):1689-1695, Dec. 2004.

Shimoda, T., et al., "Solution-Processed Silicon Films and Transistors," Nature, 440(7085):783-786, Apr. 2006.

* cited by examiner (a) Glass sheet (flat or curved)

(b) Al coating (by evaporation)

(c) Transparent Al$_2$O$_3$ nano-pillar array by anodized and pore widening (d) Tip sharpened Al$_2$O$_3$ nano-cone array

Fig. 7

Conformable/Stretchable mask sheet for guided patterning on non-flat surface (a)
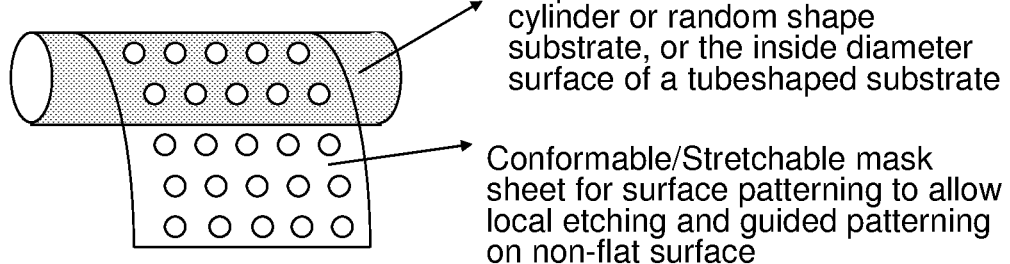

To pattern the surface of a cylinder or random shape substrate, or the inside diameter surface of a tubeshaped substrate Conformable/Stretchable mask sheet for surface patterning to allow local etching and guided patterning on non-flat surface (b)
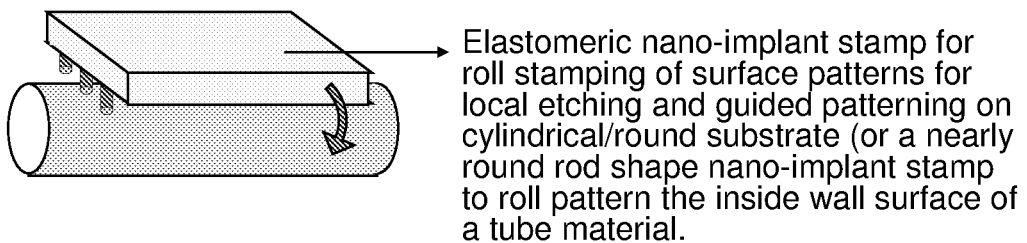

Elastomeric nano-implant stamp for roll stamping of surface patterns for local etching and guided patterning on cylindrical/round substrate (or a nearly round rod shape nano-implant stamp to roll pattern the inside wall surface of a tube material.

Fig. 24

NANOSTRUCTURED SUPERHYDROPHOBIC, SUPEROLEOPHOBIC AND/OR SUPEROMNIPHOBIC COATINGS, METHODS FOR FABRICATION, AND APPLICATIONS THEREOF

CROSS REFERENCE TO RELATED APPLICATION

This patent document claims priority to U.S. Provisional Patent Application Ser. No. 61/089,847 to Sungho Jin et al., entitled "Self-Cleaning, Superhydrophobic Coatings," and filed Aug. 18, 2008, the entire disclosure of which is incorporated herein by reference.

TECHNICAL FIELD

This patent document relates to coatings that are hydrophobic, oleophobic or omniphobic.

BACKGROUND

Clean technology is the application of the environmental sciences and engineering knowledge to conserve natural environment and resources. This emerging sector deals with products and processes that harness renewable energy sources, reduce the depletion of natural resources including water supply, and minimize pollution and waste.

With the ever increasing shortage of energy and water, clean technology may offer many opportunities for innovations, business markets and job creation. For example, water is often used for washing or cleaning of automobiles, house windows and high-rise building windows. Self-cleaning coatings on glasses which may no longer need the use of washing water can be one of the approaches to reducing water consumption.

The science and technology of self-cleaning coatings have been advancing in recent years. Their potential as a commercial product can be huge yet their global market has not been fully exploited. Potential applications of self-cleaning coatings may range from window glass, building exterior, textiles for reducing the usage of water, cleaning chemicals, and labor costs, to processes and materials for enhancing safety/reliability in transportations and communications by minimizing dirt or snow accumulations on airplane cockpit windows, wings and telecommunication antennas.

There are two different technical approaches for self-cleaning coatings—hydrophobic vs. hydrophilic. These two types of coatings both clean themselves through the action of water. The underlying mechanism in the case of hydrophobic surface is the rolling droplets taking away the dirt and dust while the sheeting water carrying away dirt is the mechanism for hydrophilic surface. Nature prefers hydrophobic self-cleaning coatings like *Lotus* leaf to hydrophilic coatings. There are more than 200 species of plants known to utilize superhydrophobic rolling droplets of water to keep clean.

Hydrophilic coatings, if a $TiO_2$ type material is used, have an additional property of photocatalytic breakdown of adsorbed organic dirt by UV (sunlight) illumination, which is then washed away when it rains. For environments with minimal rain over the year, hydrophobic self-cleaning coatings which eliminate the need to use water or chemicals may be preferred over hydrophilic coatings, as hydrophobic coatings are more proactive measures that prevent the accumulation of rain-carried dirt in the first place.

The self-cleaning action of hydrophobic coatings (commonly known as the "*Lotus* Effect") arises from their high water contact angles. Water on these surfaces can form almost spherical droplets which do not adhere to the surface at all as they roll away very easily, carrying dust and dirt with them. Dirty water falling onto a hydrophobic coating may thus be rapidly removed before it can evaporate. Droplets tend to roll only on surfaces with very high contact angles ($\theta_c$). If the contact angle is very high, e.g., $\theta_c > \sim 140$ or $160°$, the surface can be referred to as superhydrophobic.

SUMMARY

This patent document provides systems, techniques and applications for nanoscale coating structures and materials that are superhydrophobic with a water contact angle greater than about 140° or 160° and/or superoleophobic with an oil contact angle greater than about 140° or 160°. The nanostructured coatings can include Si or metallic, ceramic or polymeric nanowires that may have a re-entrant or mushroom-like tip geometry. The nanowired coatings can be used in various self-cleaning applications ranging from glass windows for high-rise buildings and non-wash automobiles to surface coatings for biomedical implants and pipeline inner surface coatings.

In one aspect, an article is disclosed to include a substrate and nanowires formed on the substrate to form a hydrophobic surface coating exhibiting a contact angle with water droplet that is greater than about 140 degrees.

In another aspect, a method of making an article is provided to include forming a silicon (Si) layer on a substrate; and etching the silicon layer to form a plurality of silicon nanowires on the substrate to provide the article having a contact angle with water droplet that is greater than about 140 degrees.

In another aspect, a method of making an article is provided to include forming a layer of aluminum oxide ($Al_2O_3$) with a plurality of pores on a substrate; and widening the plurality of pores by etching to form a plurality of aluminum oxide nanowires having tips on the substrate to provide the article having a contact angle with water droplet that is greater than about 140 degrees.

In another aspect, a method of making an article is provided to include forming a metal coating on a glass substrate; annealing the metal coating to form balled-up metal islands; and etching the glass substrate using the balled-up metal islands as a mask to form a plurality of glass nanowires to provide the article having a contact angle with water droplet that is greater than about 140 degrees.

In another aspect, an article is provided to include a substrate and a plurality of nanowires formed on the substrate and having re-entrant or mushroom tips. The article has a contact angle with water droplet and a contact angle with oil droplet that both are greater than about 140 degrees.

In another aspect, a method of making an article is provided to include forming a plurality of nanowires of a first material on a substrate; and depositing a second material onto the plurality of nanowires to form a re-entrant or mushroom tip geometry to provide the article having a contact angle with water droplet and a contact angle with oil droplet that both are greater than about 140 degrees.

In another aspect, a method of making an article is provided to include forming a plurality of nanowires having tips on a substrate; coating the tips of the plurality of nanowires with a polymer liquid; and hardening the polymer liquid coated on the nanowire tips to form a mushroom tip geometry to provide the article having a contact angle with water droplet and a contact angle with oil droplet that both are greater than about 140 degrees.

In another aspect, a method of making an article is provided to include coating a layer of metal or polymer on a substrate; annealing the metal or polymer layer to form balled-up metal or polymer islands; etching the substrate using the balled-up metal or polymer islands as a mask to form a plurality of nanowires having a re-entrant or mushroom tip geometry. One implementation of this method can include removing the balled-up metal or polymer islands to provide the article having a contact angle with water droplet and a contact angle with oil droplet that both are greater than about 140 degrees.

In another aspect, a method of making an article is provided to include forming a plurality of nanowires having tips and side walls on a substrate; depositing a surface mask over the tips of the plurality of nanowires; and etching the side walls of the plurality of nanowires to provide a re-entrant or mushroom tip geometry; and removing the surface mask to provide the article having a contact angle with water droplet and a contact angle with oil droplet that both are greater than about 140 degrees.

In another aspect, a method of making an article is provided to include providing a compliant stamp having a layer of liquid polymer disposed thereon; providing a non-flat substrate with a plurality of nanowires having tips formed thereon; pressing the compliant stamp and the non-flat substrate together so as to conform the compliant stamp to the non-flat substrate to transfer the liquid polymer onto the tips of the plurality of nanowires; and hardening the liquid polymer transferred onto the nanowire tips to form a re-entrant or mushroom tip geometry to provide the article having a contact angle with water droplet and a contact angle with oil droplet that both are greater than about 140 degrees.

In another aspect, a method of making an article is provided to include depositing a coating having a plurality of nanoparticles on a substrate, drying or heating the coating to form a plurality of islands of nanoparticles on the substrate; and etching the substrate using the plurality of nanoparticle islands as a mask to form a plurality of nanowires having a re-entrant or mushroom tip geometry. One implementation of this method includes removing the plurality of nanoparticle islands to provide the article having a contact angle with water droplet and a contact angle with oil droplet that both are greater than about 140 degrees.

In another aspect, a method of making an article is provided to include coating on a substrate a layer of material capable of decomposing into two or more phases; decomposing the material into the two or more phases; forming a plurality of islands of at least one of the two or more phases on the substrate by removing the rest of the two or more phases; and etching the substrate using the plurality of islands as a mask to form a plurality of nanowires having a re-entrant or mushroom tip geometry. In one implementation of this method, the islands can be removed to provide the article having a contact angle with water droplet and a contact angle with oil droplet that both are greater than about 140 degrees.

In another aspect, a method of making an article is provided to include covering a non-flat substrate with a conformable mask sheet having a plurality of openings; and etching the substrate through the plurality of openings to form a plurality of nanowires having a re-entrant or mushroom tip geometry to provide the article having a contact angle with water droplet and a contact angle with oil droplet that both are greater than about 140 degrees.

In another aspect, a method of making an article is provided to include contacting a conformable stamp having patterned photoresist with a surface of a non-flat substrate so as to transfer the photoresist onto the substrate surface to form an etch mask thereon; and etching the substrate through the etch mask to form a plurality of nanowires having a re-entrant or mushroom tip geometry to provide the article having a contact angle with water droplet and a contact angle with oil droplet that both are greater than about 140 degrees.

In another aspect, a method of making an article is provided to include forming on a substrate a metal or polymer coating having a plurality of nanowires with an re-entrant or mushroom geometry; removing the metal or polymer coating from the substrate; rolling up the removed metal or polymer coating into a cylinder with the plurality of nanowires disposed on an inside surface of the cylinder; applying an adhesive layer onto an outside surface of the rolled-up cylinder; and attaching the cylinder onto an inside wall of a tube by the adhesive layer to provide the article having a contact angle with water droplet and a contact angle with oil droplet that both are greater than about 140 degrees.

In another aspect, a method of making an article is provided to include coating a layer of liquid polymer on an inside surface of a tube; inserting an imprinting tool into the tube to radially imprint the liquid polymer coating; while holding the imprinting tool in place, hardening the imprinted liquid polymer coating to form a plurality of nanowires having a re-entrant or mushroom tip geometry; and removing the imprinting tool to provide the article having a contact angle with water droplet and a contact angle with oil droplet that both are greater than about 140 degrees.

In another aspect, a method of making a superhydrophobic coating is provided to include forming a thin silicon layer; and etching the silicon layer to form a plurality of silicon nanowires to provide the superhydrophobic coating that has a water contact angle greater than about 160°. Implementing of the above method may include one or more of the following features: (1) drying the silicon nanowires with supercritical $CO_2$; (2) controlling the drying of the silicon nanowires with supercritical CO2 to obtain a nanowire structure with reduced agglomeration with at least 30% less number of nanowires involved in tangled bundles; (3) the superhydrophobic coating has a water contact angle greater than about 175°; (4) oxidizing the silicon nanowires to form silica nanowires; (5) the silicon layer has a thickness of about 1-5 micrometers; (6) the silicon nanowire remaining after chemical etching has a thickness (height) of 0.1-2 micrometers; and (7) the coating is optically transparent with transmission ratio of at least 80%, preferably at least 95%.

In another aspect, a method of making a superhydrophobic coating is provided to include forming a thin alumina layer; anodizing the alumina layer to form pores; and etching the anodized alumina layer to widen the pores to form a plurality of alumina nanowires to provide the superhydrophobic coating that has a water contact angle greater than about 160°. The implementation of the above method can include one or more of the following features: (1) the alumina layer has a thickness of about 300 nanometers; (2) the hydrophobic coating has a water contact angle greater than about 165°.

In yet another aspect, a superhydrophobic coating is provided to include nanowires of silicon, silica, alumina, or combinations thereof to have a water contact angle greater than about 160°. The implementation of the above method can include one or more of the following features: (1) the coating has a water contact angle greater than about 175°; (2) the coating is optically transparent with transmission ratio of at least 80%, preferably at least 95%; (3) the substrate for the coating is a window glass for home, building, automobile or airplane.

The above and other coatings can be formed on various substrates which include telecommunication antennas, and transportation machinery including automobile bodies and airplane wings.

These and other aspects and their embodiments and implementations are described in greater detail in the drawings, the description and the claims.

BRIEF DESCRIPTIONS OF THE DRAWINGS

FIG. 1(a)-1(c) schematically illustrates contact angles for (a) hydrophilic, (b) hydrophobic, and (c) superhydrophobic surfaces. A similar definition of oleophilic, oleophobic, and superoleophobic surfaces also applies for the case of oil wetting instead of water wetting.

FIGS. 2(a)-2(d) are SEM micrographs and contact angle measurements of exemplary superhydrophobic Si nanowire arrays with regular dry ((a) & (b)) and supercritical $CO_2$ dry ((c) & (d)).

FIG. 3 shows selected movie frames illustrating superhydrophobicity on an exemplary Si nanowired surface.

FIGS. 4(a)-4(b) show an exemplary nanoscale superhydrophobic $Al_2O_3$ coating that has a water contact angle of about 165°.

FIG. 5 shows an exemplary nanoscale superhydrophobic $Al_2O_3$ coating that has a water contact angle greater than about 170°.

FIGS. 6(a)-6(d) schematically illustrate an exemplary process of widening pores on a solid substrate to create a nanowire array that can be superhydrophobic.

FIGS. 7(a)-7(d) schematically illustrate an exemplary process of sharpening the tips of nanowires by etching that may improve superhydrophobic characteristic.

FIG. 8(a)-8(d) schematically illustrate an exemplary process of fabricating a superhydrophobic glass.

FIG. 9(a)-9(e) schematically illustrate another exemplary process of fabricating a superhydrophobic glass.

FIG. 10: (a) contact angle (water droplet) vs. deposited Ag layer thickness for example RIE etched glass; (b) SEM micrograph of Ag islands that are balled up at 500° C. from an example 15 nm thick Ag layer deposited on soda-lime glass; and (c) SEM micrograph showing an example nanowired glass surface after RIE etching and removal of the Ag mask islands.

FIG. 11: (a) contact angle (water droplet) reaches a maximum at about 48 seconds of diluted HF chemical etching through the unprotected (shadowed) regions in an example soda-lime glass surface that is masked by balled-up Ag with Ti/Au coating; and (b) SEM micrograph showing an example glass surface that has been etched with diluted HF with about 48 seconds.

FIG. 19(a)-19(d) schematically illustrate an exemplary process of fabricating a polymer-based, superomniphobic surface.

Figure 20:
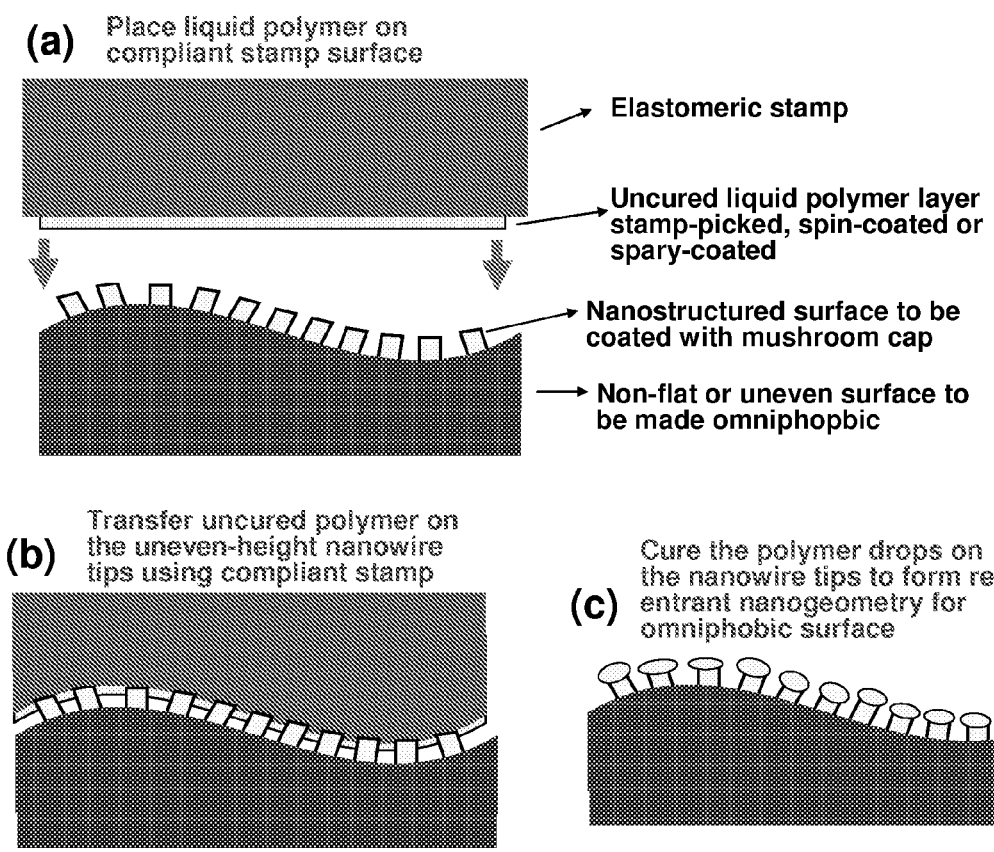
Figure 21:
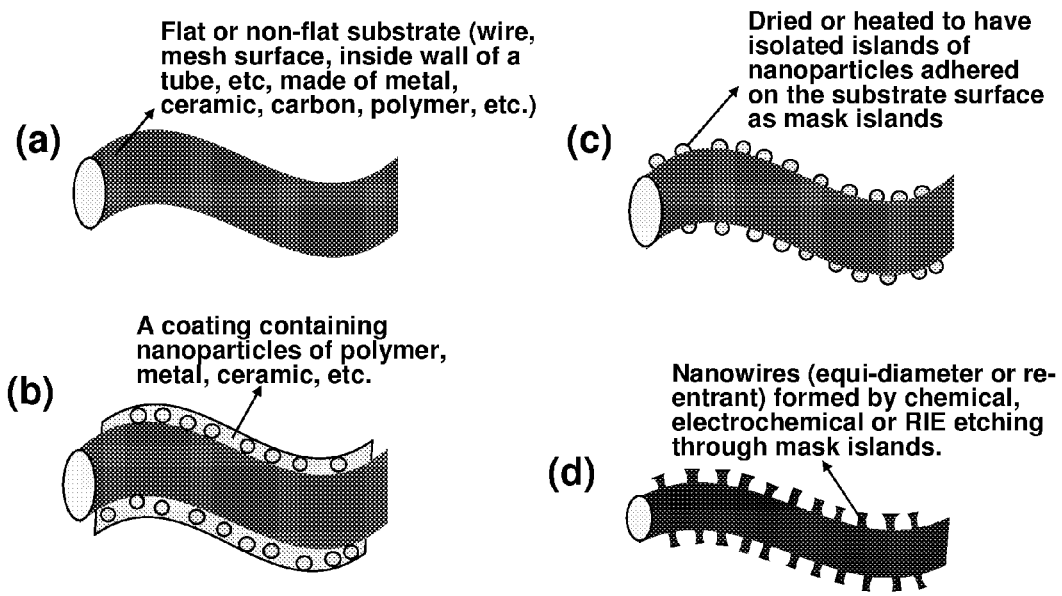
Figure 22:
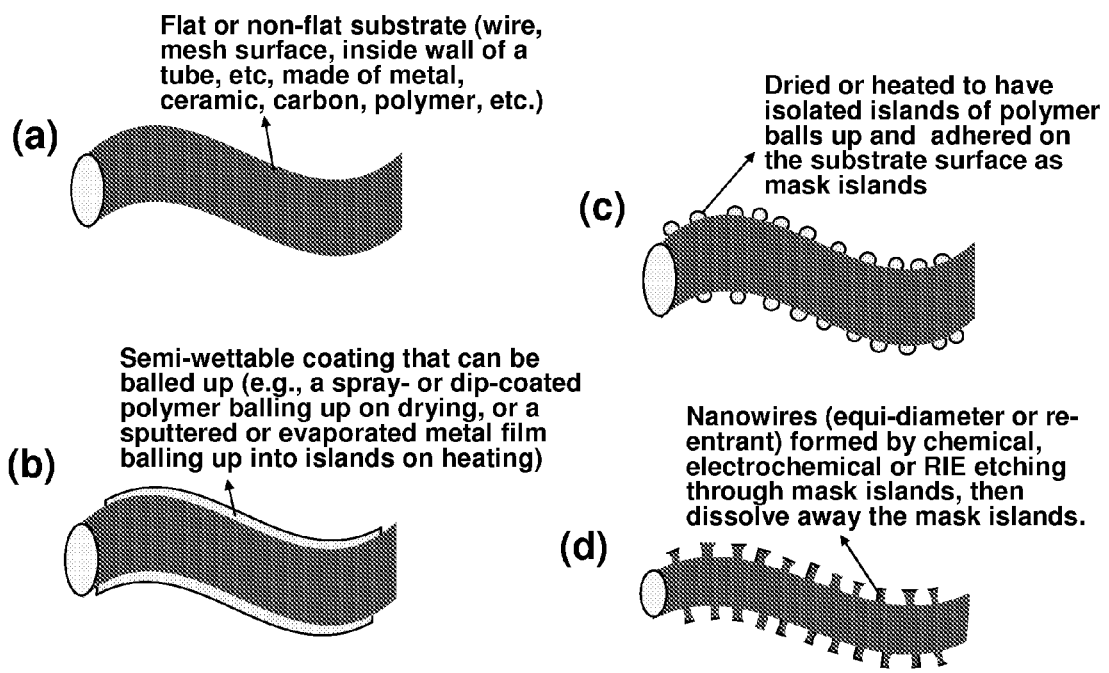
Figure 23:
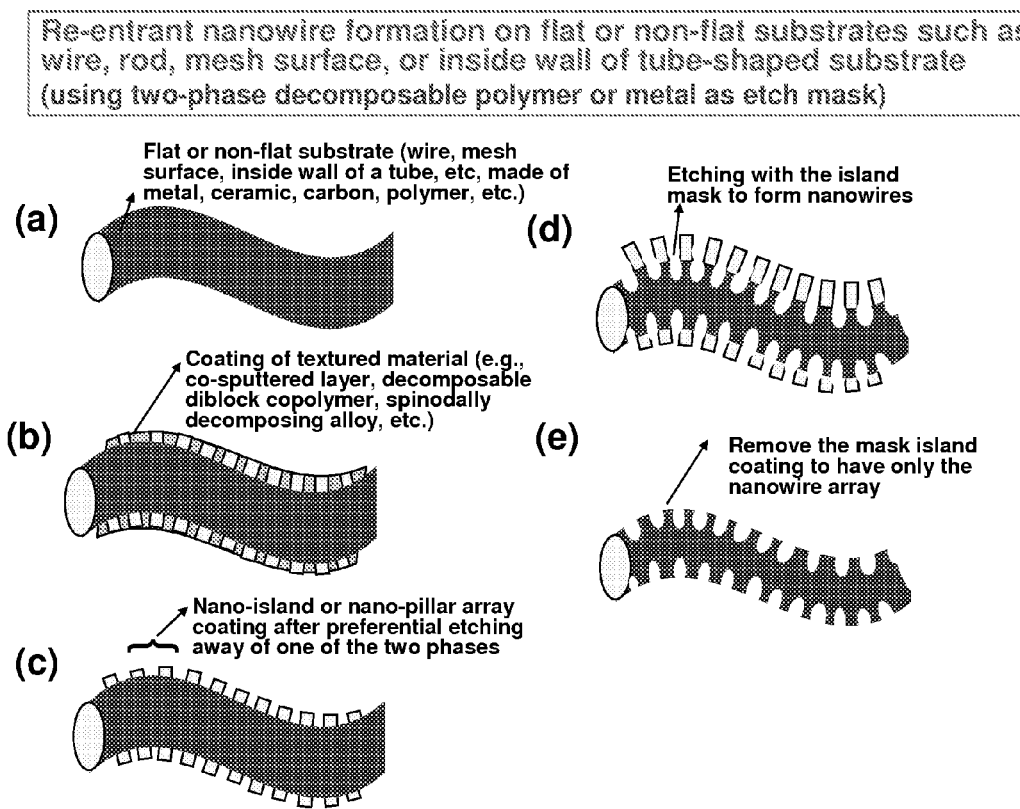

FIG. 20(a)-20(c) schematically illustrate an exemplary process of fabricating a superomniphobic coating on a non-flat surface.

FIG. 21(a)-21(d) schematically illustrate an exemplary process of fabricating a superhydrophobic, superoleophobic, and/or superomniphobic coating on a substrate.

FIG. 22(a)-22(d) schematically illustrate another exemplary process of fabricating a superhydrophobic, superoleophobic, and/or superomniphobic coating on a substrate.

FIG. 23(a)-23(e) schematically illustrate yet another exemplary process of fabricating a superhydrophobic, superoleophobic, and/or superomniphobic coating on a substrate.

FIG. 24(a)&24(b) schematically illustrate a further exemplary process of fabricating a superhydrophobic, superoleophobic, and/or superomniphobic coating on a substrate.

Figure 25:
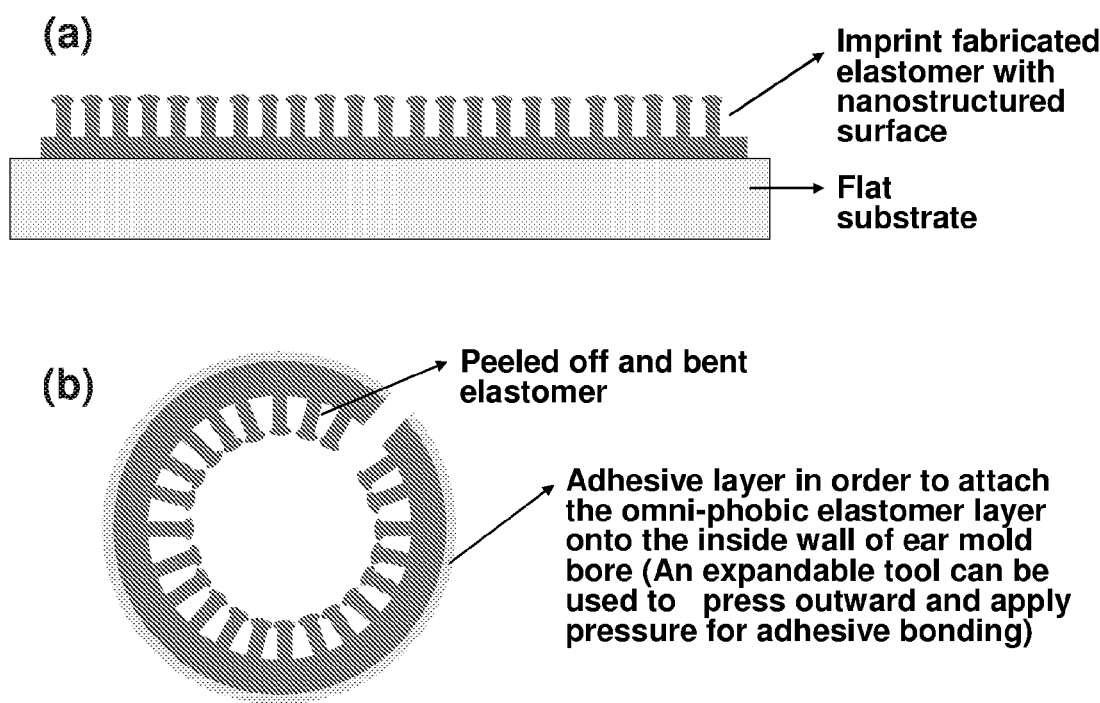

FIG. 25(a)&25(b) schematically illustrate an exemplary process of forming a superhydrophobic, superoleophobic and/or superomniphobic surface on the inside wall of a tube-shaped substrate.

Figure 26:
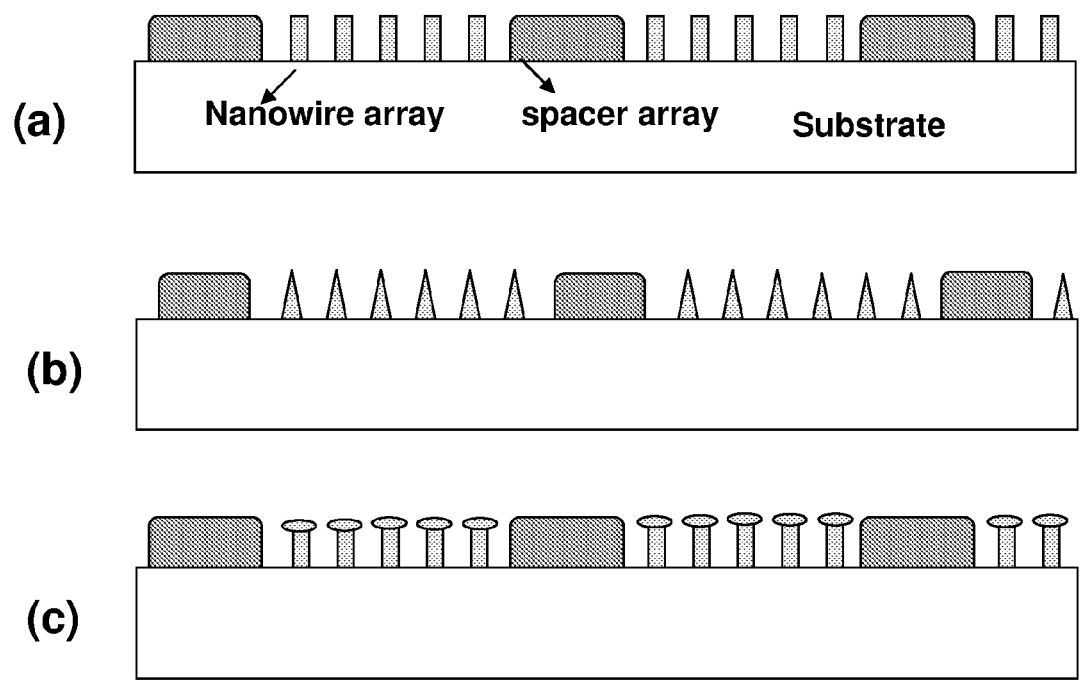

FIG. 26(a)-26(c) schematically illustrate exemplary nanowired coating structures with protective spacer array to withhold compressive and/or shear stresses.

DETAILED DESCRIPTION

Figure 1:
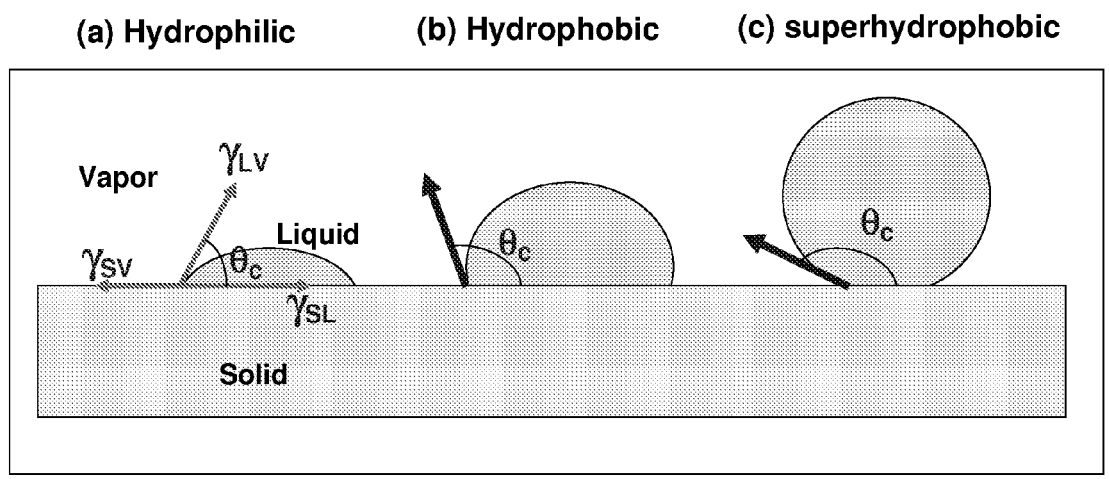
Figure 2:
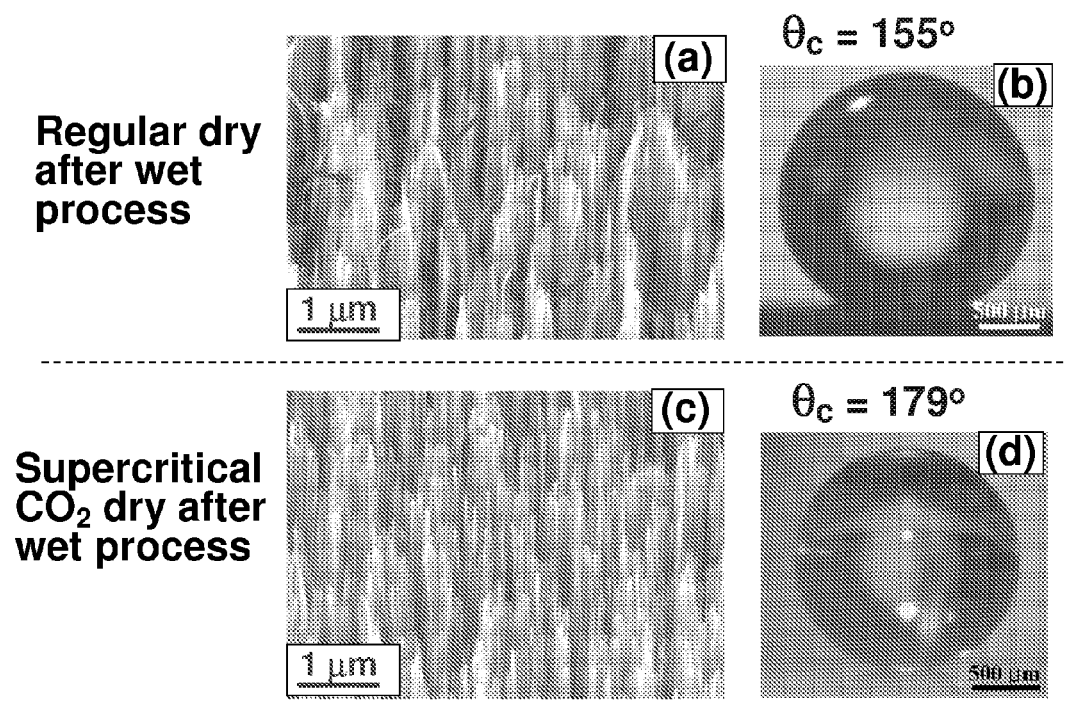

Understanding the behavior of water droplets on a surface can help design superhydrophobic self-cleaning coatings. The interplay between the surface free energies of the solid-liquid, solid-gas and liquid-gas boundaries often determines the water contact angle. FIG. 1 schematically illustrates contact angles for hydrophilic, hydrophobic, and superhydrophobic surfaces. For contact angle of less than 90°, the surface wetting is more energetically favored for such hydrophilic surface. If the dry surface is more favored, then the surface is hydrophobic, and its contact angle is greater than 90°. In the Cassie-Baxter Model (which is also called "the air pocket model"), the presence of the two-phased surface is assumed, with one of the phases being air. In this model, air can be trapped below a water drop, with the drop sitting mostly on air leading to a superhydrophobic behavior. The Cassie-Baxter Model may be represented by the following equation:

$$\cos \theta_c = f_1 * \cos \theta_1 + f_2 * \cos \theta_2 \qquad (1)$$

where $\theta_c$ is the apparent contact angle of the liquid droplet, $f_1$ and $f_2$ are the projected area fraction of phase 1 (e.g., water) and phase 2 (e.g., air), respectively. The angles $\theta_1$ and $\theta_2$ are the equilibrium contact angle of the droplet on flat surface of the phase 1 and phase 2 materials, respectively. Since the water contact angle $\theta_2$ in air is 180° (non-wetting), $\cos \theta_2 = -1$. Together with the relationship of $f_1 + f_2 = 1$, Eq. (1) becomes:

$$\cos \theta_c = f_1 * (\cos \theta_1 + 1) - 1 \qquad (2)$$

If $f_1$ is very small, like a sharp needle array, there can be a relatively large amount of air under the water droplet, and cos $\theta_c$ may approach −1 with the water droplet contact angle $\theta_c$ becoming closer to 180° in the case of superhydrophobic surface.

By utilizing a film of chemically hydrophobic materials such as fluorinated polymers, the contact angle can be made in the regime of 90-130°. However, the contact angles of flat polymer layers may not be high enough to cause the rolling motion necessary for true self-cleaning. Geometrical surface roughness can help impart superhydrophobicity.

While superhydrophobic surface can be used to prevent or minimize wetting of water, there may be needs to reduce or avoid wetting of oil based or organic based contaminants. For such applications, superoleophobic (non-wetting for oils) surface may be used. If the surface coating is highly resistant to both water and oil wetting (superomniphobic), it may prevent or minimize contamination of various surfaces against a number of different types of contaminants.

This patent document provides systems, techniques and applications for hydrophobic, oleophobic and/or omniphobic coating structures and materials that are based on nanostructure manipulations. For example, nanostructured materials having superhydrophobic, superoleophobic and/or superomniphobic (both superhydrophobic and superoleophobic with water and oil contact angles both greater than about 140° or 160°) characteristics are described. Such materials can be useful for industrially viable self-cleaning (e.g., no or reduced need to wash/clean) coating materials, as well as water-proof and/or oil-proof coatings.

In various embodiments, the superhydrophobic, superoleophobic and/or superomniphobic coating structures and materials described herein can include Si nanowires, or metallic, ceramic or polymeric nanowires. Representative examples of suitable metallic nanowires can include nanowires based on Ni, Co, Au, Pt, Pd, W or their alloys. Representative examples of suitable ceramic nanowires can include nanowires based on single element or alloy oxides (e.g., $Al_2O_3$, ZnO, MgO, $SiO_2$, $TiO_2$, $ZrO_2$, and other transition metal or refractory metal oxides), carbides, nitrides, silicides, borides, or fluorides. Representative examples of suitable polymeric nanowires can include nanowires based on PMMA (polymethyl methacrylate) or PDMS (polydimethylsiloxane).

In various implementations, the Si nanowires and metallic, ceramic or polymeric nanowires can be prepared by a number of different means. For example, the nanowires may be fabricated by electroless chemical etching, electrochemical etching, patterned (masked) chemical etching, patterned (masked) deep-UV (DUV) etching, self assembly growth, chemical vapor growth, physical vapor growth, and electrochemical deposition.

In some embodiments, the nanowires can have an average diameter of about 10-500 nm. In some embodiments, the nanowires can have an average diameter of about 20-200 nm. In some embodiments, the nanowires can have an average diameter of about 30-100 nm.

In some embodiments, the nanowires can have an average height of about 0.1-200 μm. In some embodiments, the nanowires can have an average height of about 1-100 μm. In some embodiments, the nanowires can have an average height of about 5-50 μm.

In some embodiments, the nanowires can have an average density of about 15-25 nanowires/μm². In some embodiments, the nanowires can have an average density of about 40-60 nanowires/μm². In some embodiments, the nanowires can have an average density of about 80-120 nanowires/μm².

In various embodiments, the superhydrophobic, superoleophobic and/or superomniphobic coating structures and materials described herein can have a water contact angle and/or an oil contact angle that are greater than about 140°, 150°, 160°, 170°, 175° or even 178°.

Some embodiments can include superhydrophobic Si nanowire coatings. Some embodiments can include superhydrophobic coatings using $Al_2O_3$ nanostructures that may be optically transparent. Some embodiments can include superhydrophobic glasses with induced surface nanostructures. Some embodiments can include superomniphobic coatings that are based on Si, ceramic or metallic nanowires with modified tip geometry. Some embodiments can include polymer-based, superomniphobic surfaces. Some embodiments can include cylindrical, superomniphobic elastomer surfaces.

FIGS. 2(a)-2(d) show SEM micrographs and contact angles measured on exemplary silicon (Si) nanowires that are superhydrophic. In some implementations, the Si nanowires can be fabricated by chemically etching a Si substrate at about room temperature. In some embodiments, the Si substrate can be etched using a mixed etchant of HF and $AgNO_3$ (e.g., 4.6 and 0.02 mol/liter, respectively). In some embodiments, the Si nanowires can be dried using supercritical $CO_2$ ($scCO_2$), which may remove undesirable tangling and bundling of the Si nanowires. After $scCO_2$ dry, the contact angle of a water droplet on the Si nanowire coating can become very large, e.g., about 178-179°, indicating high superhydrophobicity of the nanostructured Si coating.

Figure 3:
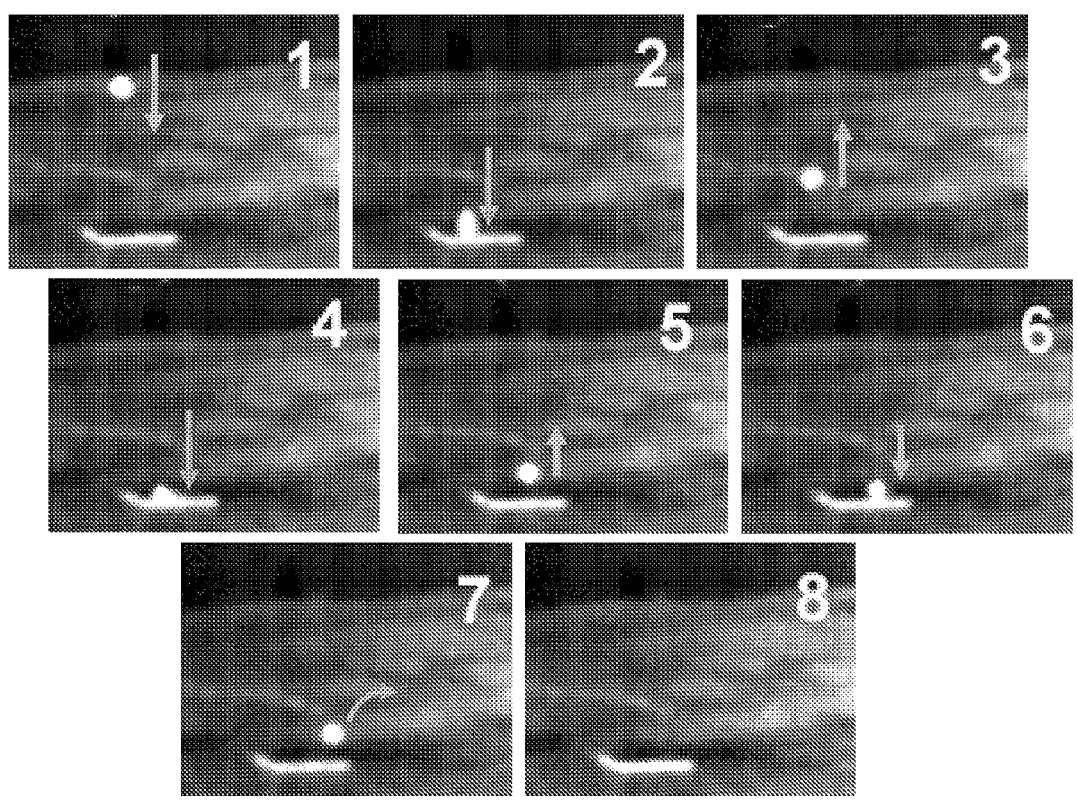

FIG. 3 shows some frames of a movie taken for a bouncing water droplet which is so hydrophobic that it doesn't sit on the sample Si nanowired surface. The substrate would have to be vacuum suctioned to intentionally create a concave surface (curved by about 1-2 degrees) to make the droplet stay in place so as to enable the measurement of the contact angle.

Two approaches may be used for large area fabrication of superhydrophobic Si nanowire coatings. One approach is to use liquid Si deposition method as a means of providing thin Si layer as the basis for Si nanowire formation. In some implementations, diluted cyclopentasilane ($Si_5H_{10}$) solution may be spin coated on glass substrates, UV cured and annealed at about 300° C. to form a thin Si layer, which can then be chemically etched to form a superhydrophobic Si nanowire coating structure. Another approach is to continuously evaporate a thin film of Si (e.g., about 1-2 micrometer thick) on glass surfaces, followed by chemical etching to form superhydrophobic Si nanowire coatings. The Si nanowires can then be oxidized to $SiO_2$ to become optically more transparent. While one can use single crystal or polycrystal Si wafers to fabricate surface Si nanowires, using such Si can be costly, and Si is often opaque, rather than transparent.

Figure 4:
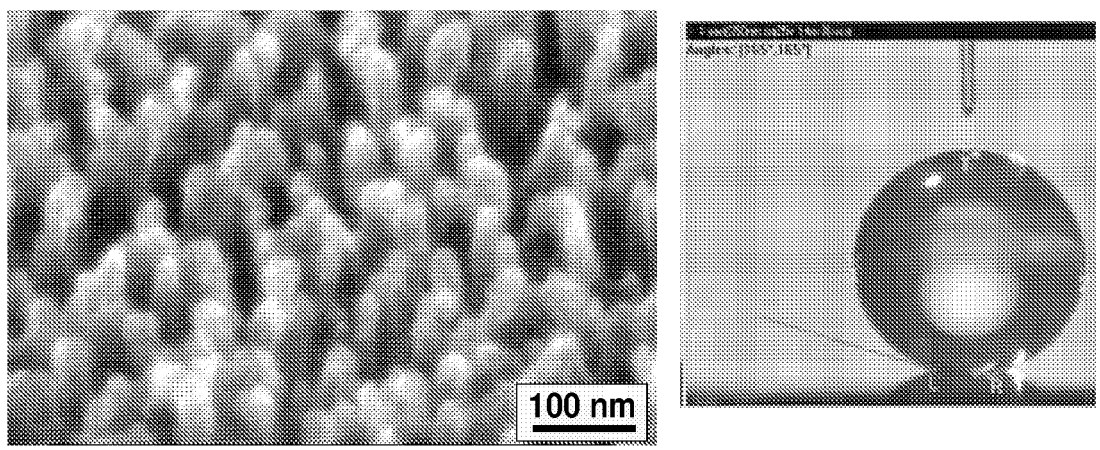
Figure 5:
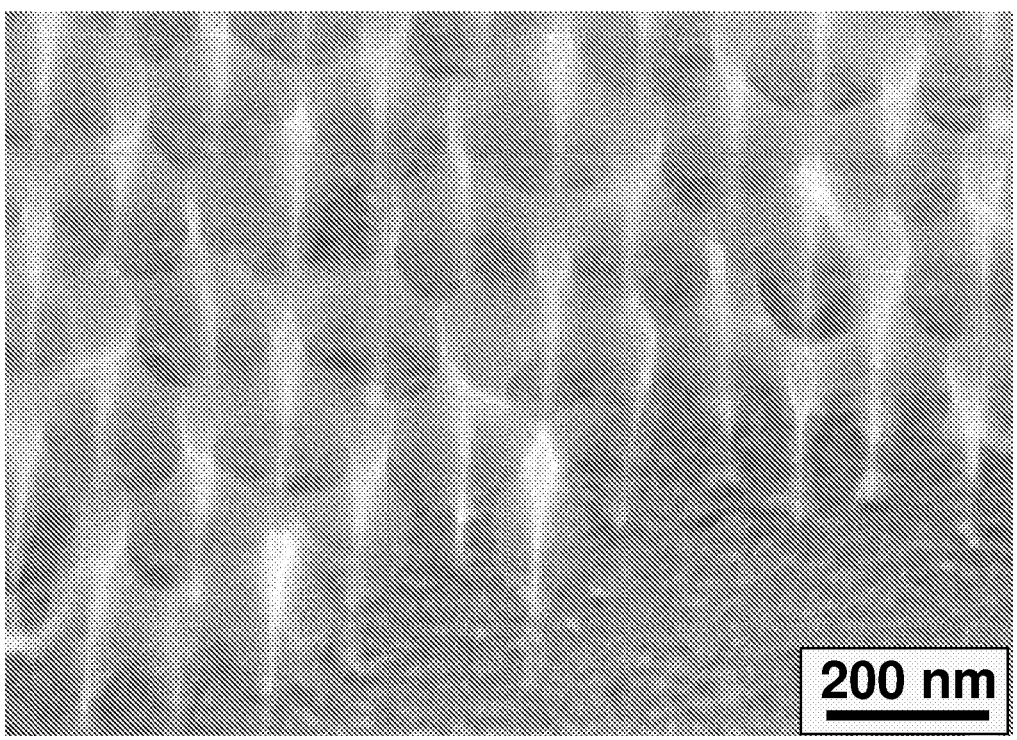
Figure 6:
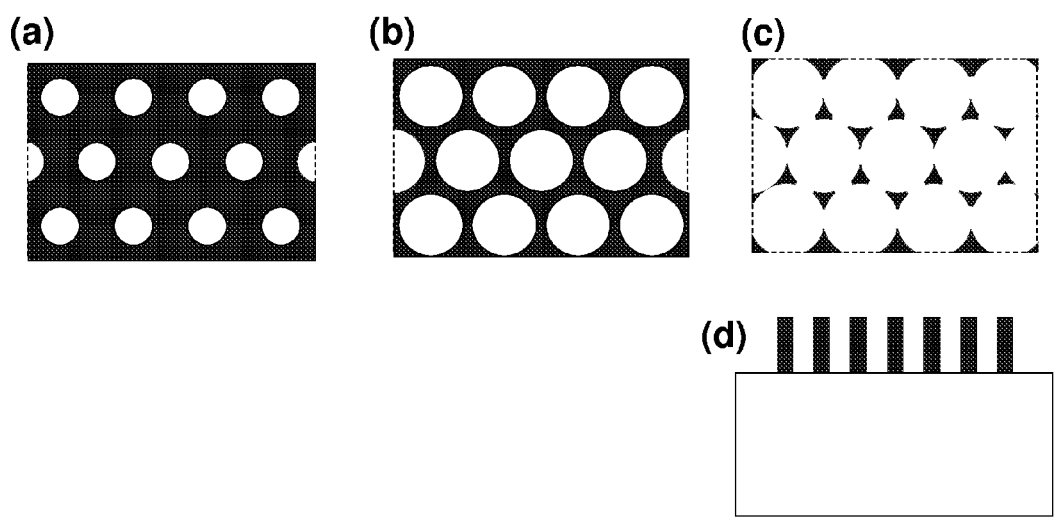

Another type of superhydrophobic coatings can use aluminum oxide ($Al_2O_3$) nanostructures. FIG. 4 shows an exemplary superhydrophobic $Al_2O_3$-based coating that includes a nanowire structure having about 30 nm scale and about 100 nm thick $Al_2O_3$ nanowire arrays. In some implementations, the $Al_2O_3$ coating can be made by room temperature aluminum (Al) layer evaporation, followed by anodization treatment at room temperature. In some embodiments, the Al layer can be about 300 nm thick on a solid substrate. In some embodiments, the anodization treatment can be conducted using 0.3 M oxalic acid by applying 20 V voltage. The $Al_2O_3$ nanowire coating can be optically transparent. The $Al_2O_3$ nanowire coating may have small cross-sectional area (small $f_1$ in Eq. 2), which can make the coating highly superhydrophobic. In some embodiments, the $Al_2O_3$ nanowire coating can have a contact angle of at least about 165° in an unoptimized condition. The microstructure of the $Al_2O_3$ coating can be further refined by inducing periodic and equal diameter anodized holes followed by uniformly etching/pore-widening. In some implementations, the contact angle may be further increased to about 170° or higher (see, e.g., FIG. 5). In some implementations, the $Al_2O_3$ nanowire arrays can be made by first fabricating vertical pore arrays of anodized $Al_2O_3$, then employing a pore widening chemical etch so that the neighboring pores may eventually meet and the remaining triangular regions can become like nanowire arrays. FIG. 6(a)-(6d) illustrate an example of a fabrication of such an array. In some implementations, the $Al_2O_3$ nanowire array can be sharpened with chemical etch or reactive ion etch (RIE) so that the contact angle may be further increased. As illustrated in FIGS. 7(a)-7(d), an aluminum coating can be first deposited on a glass sheet surface which may be flat or curved. A vapor deposition process, for example, may be used to form this aluminum coating. The aluminum layer is then treated by an anodization treatment to form a layer of $Al_2O_3$ nanowires that are highly superhydrophobic. Next, the $Al_2O_3$ nanowire array can be sharpened with chemical etch or reactive ion etch (RIE) so that the contact angle may be further increased to improve the superhydrophobic property. $Al_2O_3$ is often mechanically stronger than Si and thus may provide a more durable superhydrophobic coating than Si.

Yet other examples of superhydrophobic nanowire structures can include self-cleaning glasses with induced surface nanostructures that may be transparent. In some implementations, the superhydrophobic glasses can be fabricated using metal ball-up process followed by etching. In some embodiments, the superhydrophobic glasses can be fabricating by surface metal layer deposition, ball-up annealing and reactive ion etch. FIGS. 8(a)-8(d) illustrate an exemplary process in which, a layer of silver (Ag) can first be deposited on the surface of a soda-lime glass and the Ag layer can then be annealed to form balled-up Ag islands on the glass surface. Using the Ag islands as a mask, the glass can be etched using RIE to form a nanowire array. The Ag islands can then be optionally removed to expose the glass nanowire array.

In some embodiments, the superhydrophobic glasses can be fabricated using chemical etch through shadow regions on metal ball-up islands. FIGS. 9(a)-9(d) show an example. A layer of Ag can first be deposited on the surface of a soda-lime glass. The Ag layer can then be annealed to form balled-up Ag islands on the glass surface. A protective layer can be coated over the balled-up Ag islands and the exposed glass surface by sputter deposition of Ti/Au, while leaving the corner regions between the Ag islands and the glass surface open to chemical etching so as to form nanowires. The Ag islands with Ti/Au coating can then be removed to expose the glass nanowire array.

Figure 8:
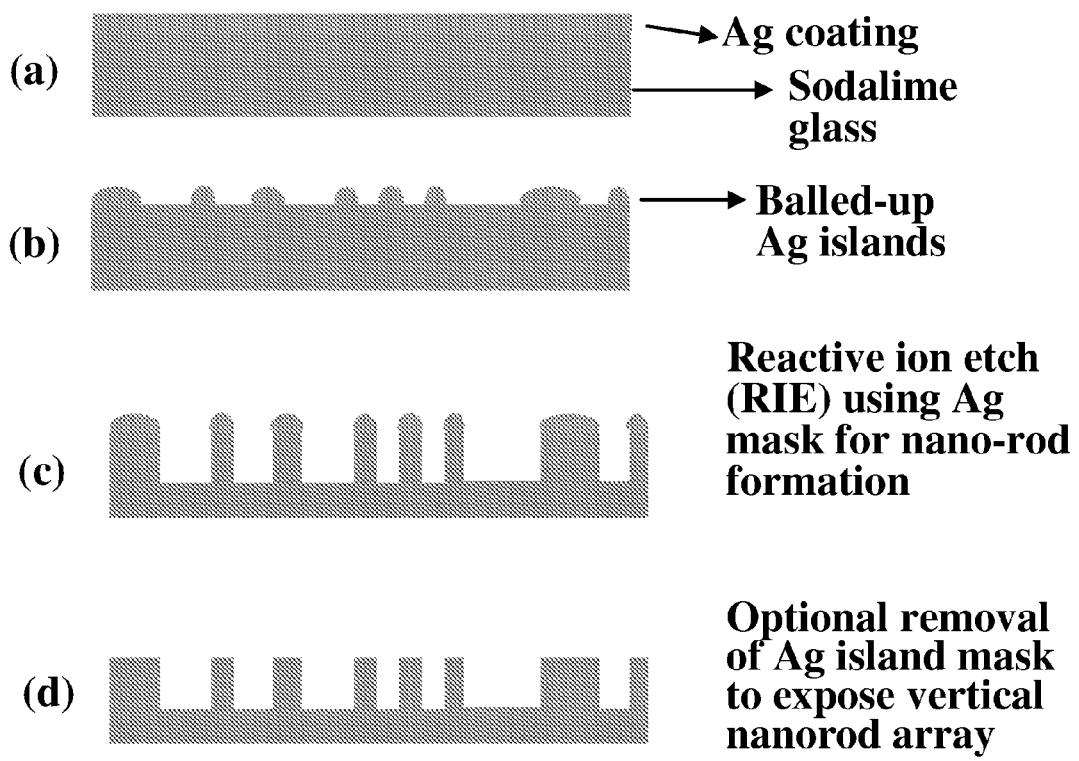
Figure 10:
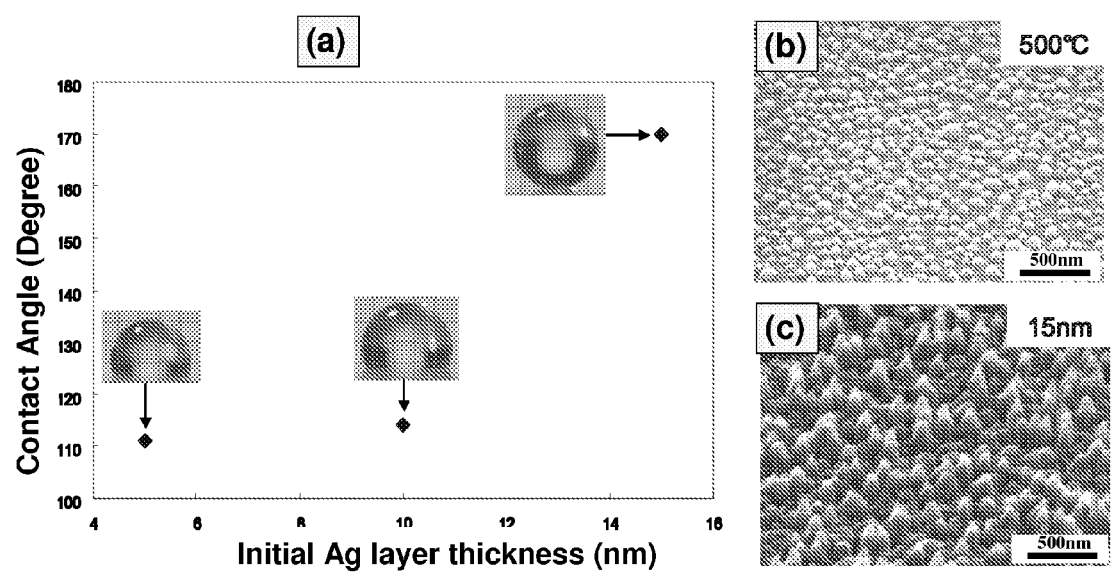

FIG. 10 shows an example of a superhydrophobic glass that can be fabricated using the process illustrated in FIG. 8. FIG. 10(a) shows that the water contact angle can increase to about 170° when the initial Ag layer thickness is increased to about 15 nm. FIG. 10(b) shows that a 15 nm Ag layer deposited on a soda-lime glass can ball up into Ag islands at about 500° C. FIG. 10(c) shows an exemplary nanowired glass surface that can be formed by RIE over the glass substrate using the Ag islands as a mask.

Figure 9:
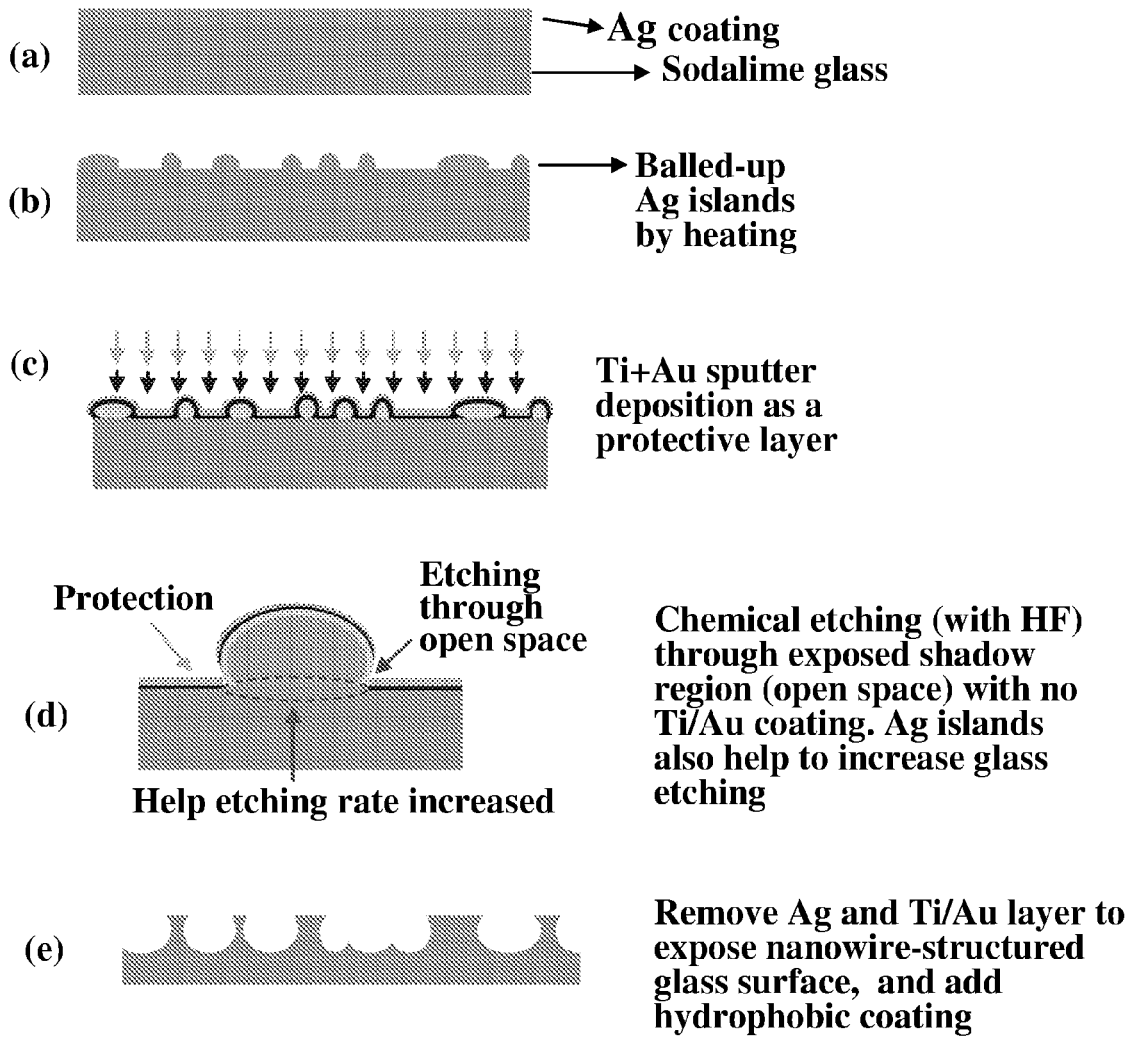
Figure 11:
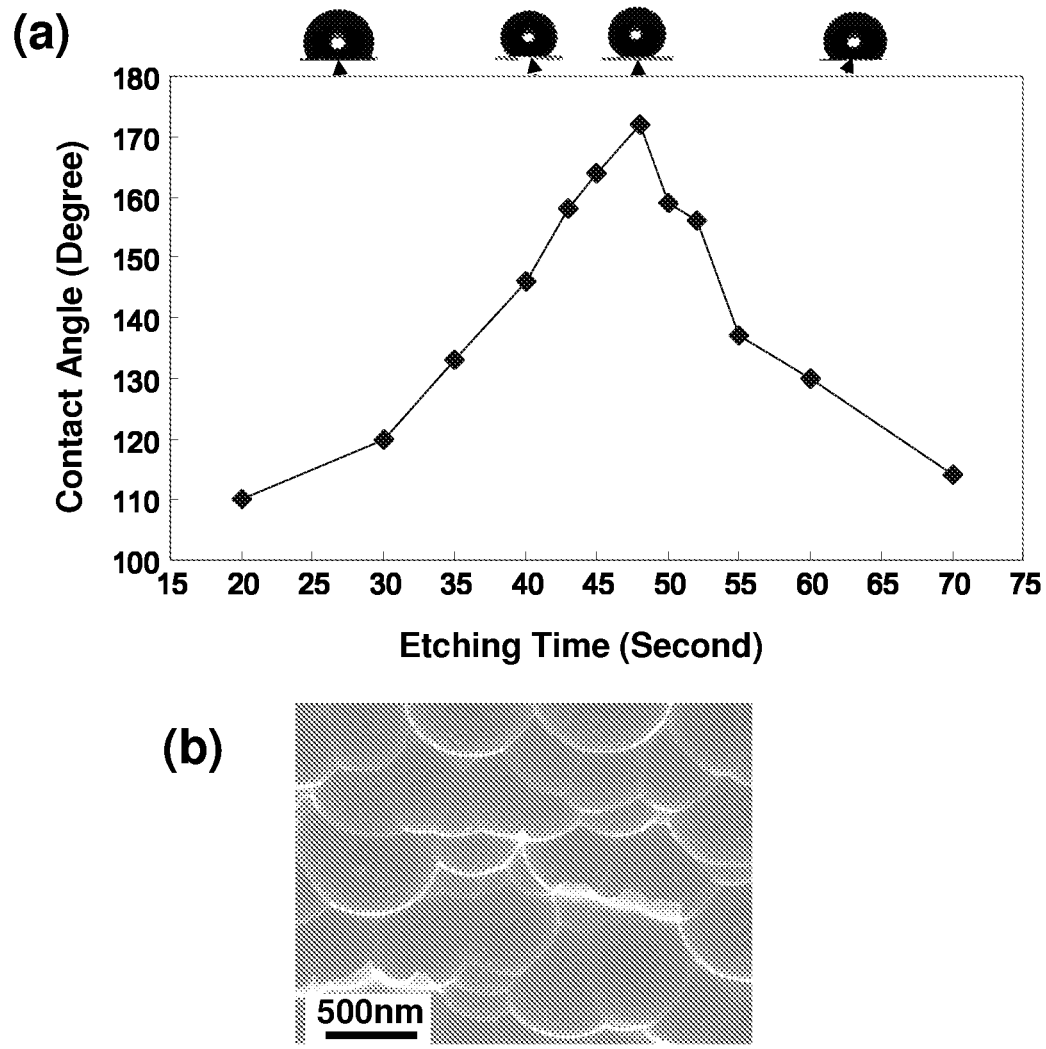

FIG. 11 shows an example of a superhydrophobic glass that can be fabricated using the process illustrated in FIG. 9. FIG. 11(a) shows that the water contact angle can increase from about 110° to about 172° when the chemical etching is increased from about 20 seconds to about 48 seconds and then decrease to about 115° when further increasing the chemical etching time to about 70 seconds. The highest contact angle can be about 172 degree at 48-second etching, and the contact angles over 150 degree may be obtained for an etching period in the range of about 43-52 seconds. FIG. 11(b) shows an example of a nanostructured, superhydrophobic glass surface that has been etched with a diluted HF for about 48 seconds.

Figure 12:
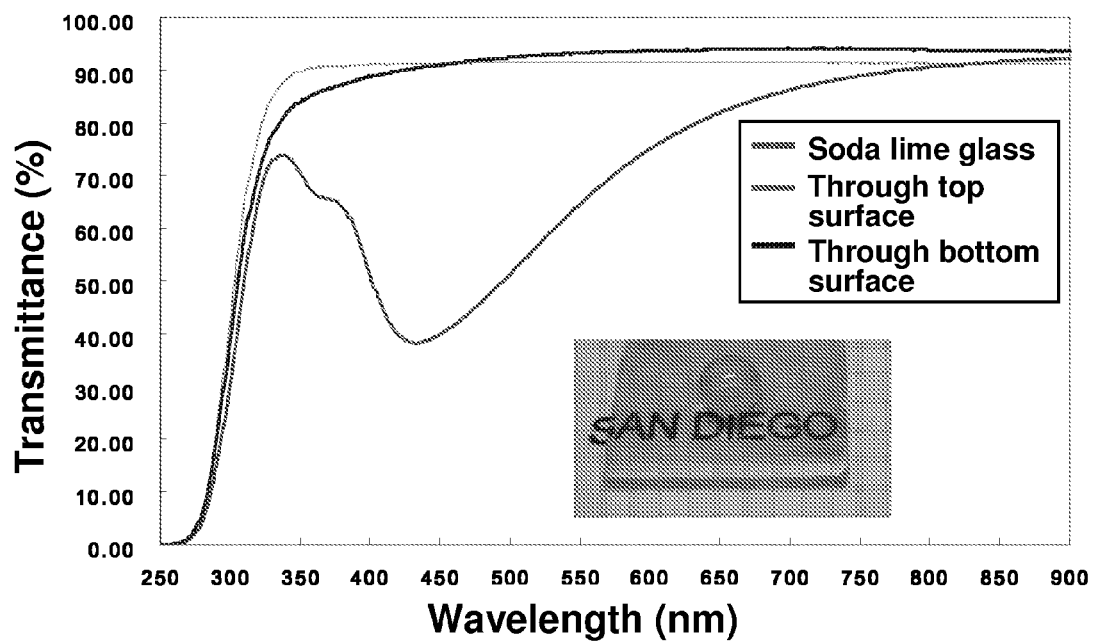
FIG. 12 shows optical transmission behavior of an example non-symmetrical transmission glass with leftover Ag islands that is made by RIE etching. The inset shows a semi-transparent behavior.

In some embodiments, the superhydrophobic glasses described herein can have a non-symmetrical light transmission (e.g., the light transmission from one side of the glass is very different from the light transmission through the opposite direction, like a one-way transmission) when the masking islands aren't removed after the glass has been etched. Such glasses may be useful for special window applications. FIG. 12 shows an example of a non-symmetrical transmission glass that can be made by RIE etching. In this exemplary glass, the light transmission from the bottom to the top shows slightly suppressed transmission (tinted) in the UV to visible wavelength regime of about 320-800 nm, while the light transmission from the top to the bottom is highly asymmetrical (one-way like) with particularly suppressed transmission in the UV to violet wavelength range of about 330-450 nm.

Figure 13:
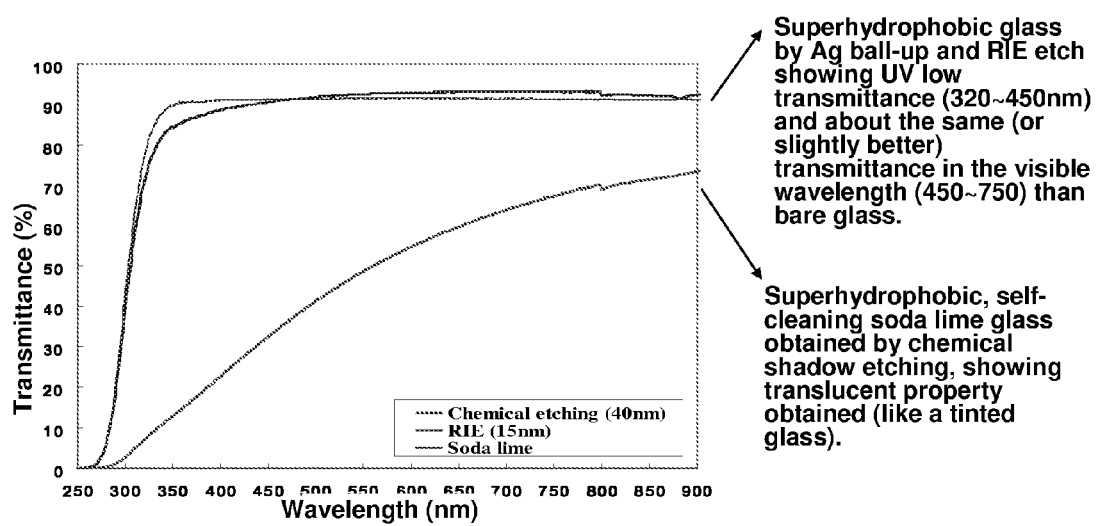
FIG. 13 shows a comparison of optical transmission behavior between an example glass made using Ag ball-up masked RIE and an example glass made by shadowed chemical etching.

In some embodiments, the superhydrophobic glasses described herein can have UV-reducing or tinting optical transmission properties. Such properties may be useful for window glass applications for reduction of UV radiation entering a building or room interior. FIG. 13 shows an example of a tinted glass that can be made by shadowed chemical etching. Compared with RIE etching, the chemical etch method may produce more tinted glasses with reduced light transmission that is more pronounced at shorter wavelengths (near the UV regime).

For many self-cleaning applications, superomniphobic coatings that are both superhydrophobic and superoleophobic may be needed. For example, superomniphobic surfaces can minimize fouling of implanted devices such as stents and various other surfaces of implants and human-body-touching medical devices by reducing the adherence of water-based liquid as well as oil-based liquid.

In various embodiments, superomniphobic coatings can include a nanoscale re-entrant tip/mushroom geometry that may be fabricated by a number of different approaches. For example, the re-entrant/mushroom nanostructure geometry can be made by first forming a nanowire structure, followed by sputter or evaporation coating of Si, or metallic, ceramic or polymeric materials or graphite, optionally at a vertical angle or preferably at an oblique incident angle, so as to selectively add more material near the tip of the nanowires. The nanoscale re-entrant/mushroom geometry can also be made by first preparing a nanowire structure and then brush coating or spray coating of polymer material on the nanowire surface so as to selectively add more material near the tip of the nanowires. The re-entrant/mushroom nanostructure geometry can further be made by first spin coating a thin layer of liquid polymer (e.g., PMMA or PDMS) on a flat substrate (e.g., Si) and then contact a pre-fabricated nanowired structure with the liquid polymer coating to allow the tips of the nanowires to adsorb a small amount of the liquid polymer that can be cured later. The nanoscale re-entrant/mushroom geometry can also be made by first coating a thin layer of metal or polymer on a substrate, followed by balling-up of the metal or polymer coating to form discrete nano-islands and then etching of the substrate using the metallic or polymeric nano-islands as a mask. The nanoscale re-entrant/mushroom geometry can further be made by first forming a nanowire structure, followed by adding a surface mask at the tips of the nanowires, or on or near the top surface of the nanowire structure by physical or chemical deposition of metal, ceramic, carbon or less soluble or non-soluble polymer. Chemical or RIE etch can then be used to selectively (or preferentially) remove material from the nanowire walls rather than from the nanowire tips, followed by removal of the mask material.

Figure 14:
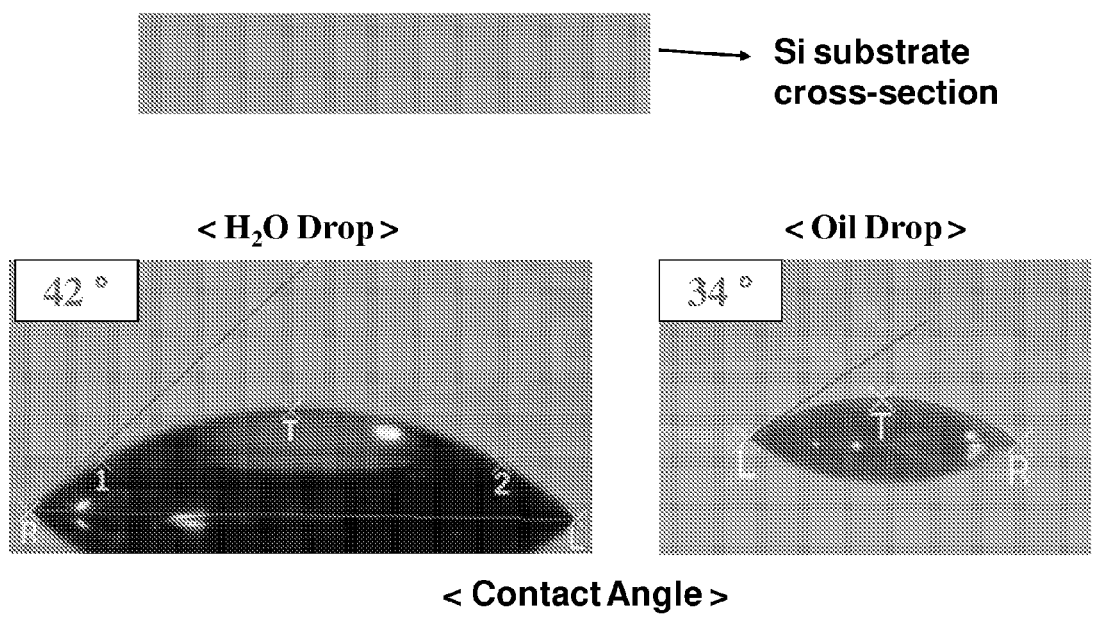
FIG. 14 shows contact angles of water droplet and oil droplet on a sample flat, untreated Si surface.
Figure 15:
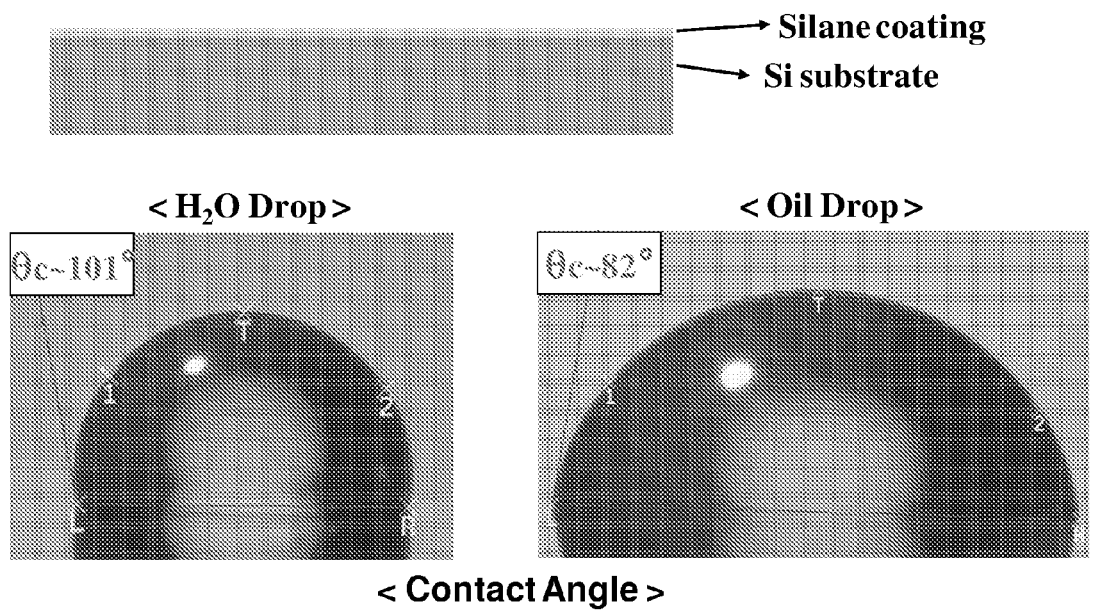
FIG. 15 shows contact angles of water droplet and oil droplet on the sample flat Si surface shown in FIG. 14 that is coated with silane.

FIG. 14 shows the contact angle data of water droplet and oil droplet on a sample Si surface. Both water and oil can wet the silicon surface reasonably well with small contact angles, thus Si is neither hydrophobic or oleophobic or omniphobic. When the sample Si surface shown in FIG. 14 is coated with silane, the contact angles may increase (see FIG. 15), but the surface is still not superhydrophobic or superoleophobic or superomniphobic. When the sample Si surface shown in FIG. 14 is made into a nanoneedle geometry that includes Si nanowires having sharp tips, the nanowired Si surface can become superhydrophobic with a very large water contact angle of about 178°, and become closer to superoleophobic with a large oil contact angle of about 128° (see FIG. 16).

Figure 16:
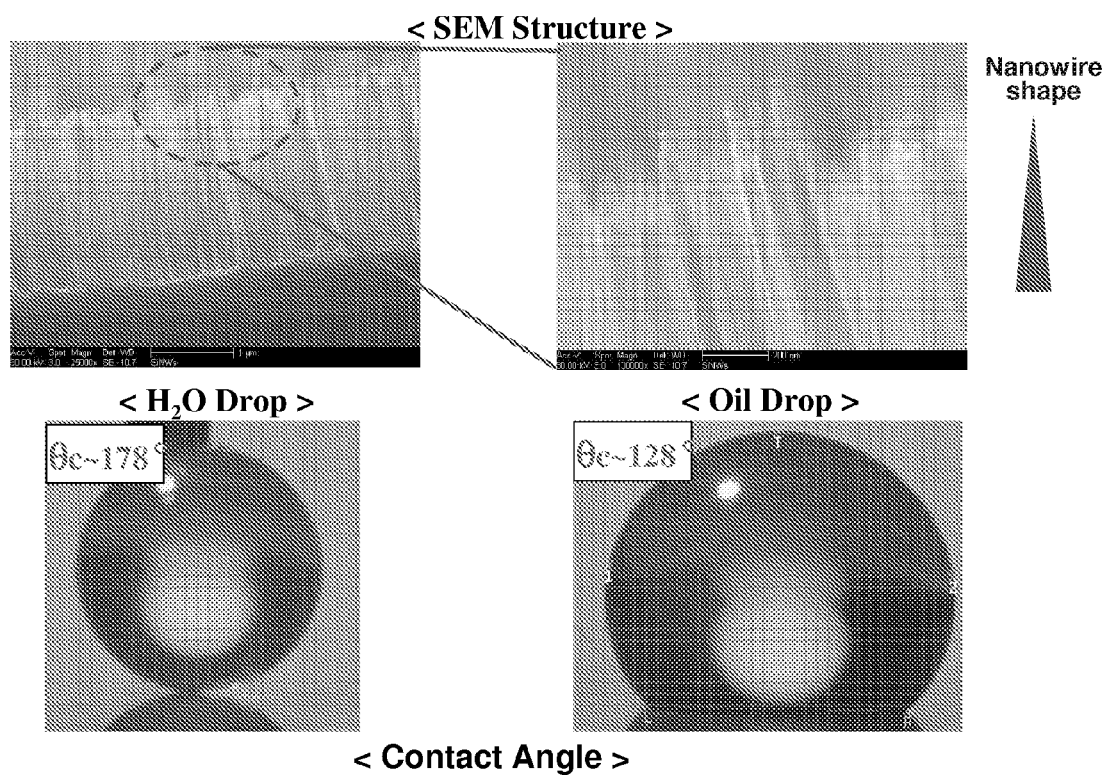
FIG. 16 shows contact angles of water droplet and oil droplet on the sample flat surface shown in FIG. 14 that is made into a nanowired surface with silane coating.

The Si nanowire structure of FIG. 16 can become superomniphobic (both superhydrophobic and superoleophobic with water and oil contact angles both greater than about 140° or 160°) by preferentially depositing extra Si material near the tips of the Si nanowires to create a nanoscale re-entrant/mushroom tip geometry on the Si nanowired surface. In some embodiments, the extra Si deposited can have an average thickness of about 10-30 nm. In some embodiments, the extra Si deposited can have an average thickness of about 80-120 nm. In some embodiments, the extra Si deposited can have an average thickness of about 150-250 nm. In some implementations, the extra Si can be deposited at an oblique incident angle of about 45° or less. In some implementations, the extra Si can be deposited at an oblique incident angle of about 30° or less. In some implementations, the extra Si can be deposited at an oblique incident angle of about 10° or less. In some implementations, the substrate stage can rotate during deposition so as to form a uniform coating of Si on the tip area of the nanowires.

Figure 17:
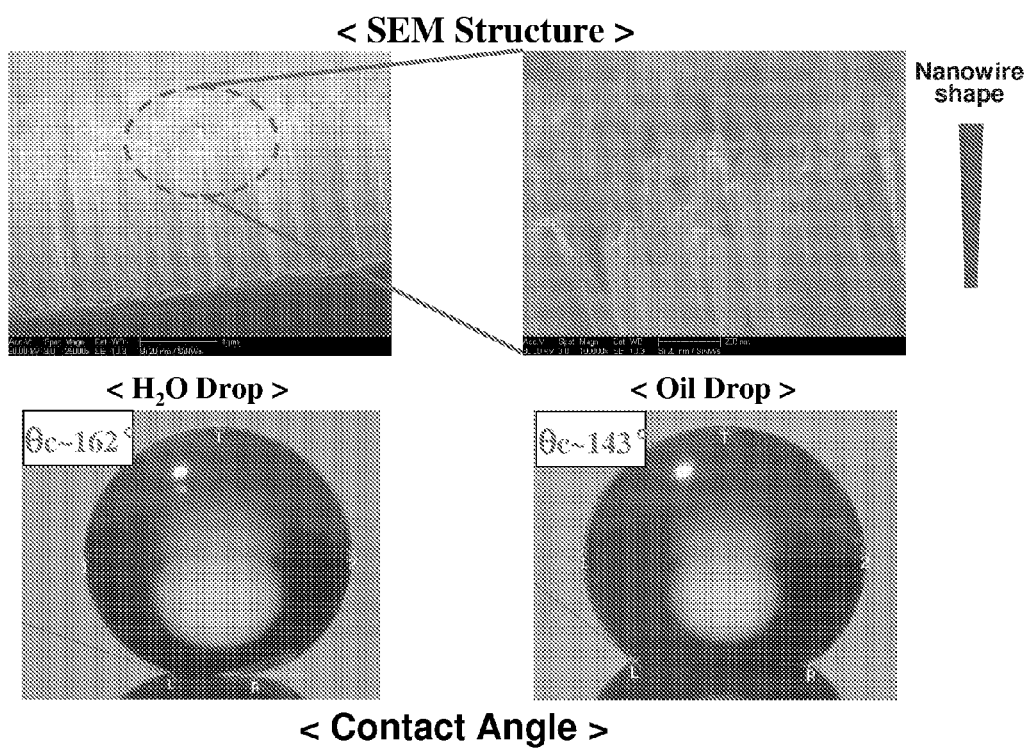
FIG. 17 shows wetting behavior of water and oil droplets on the Si nanowired surface of FIG. 16 that is modified by oblique incident deposition of about 20 nm thick Si film with silane coating.
Figure 18:
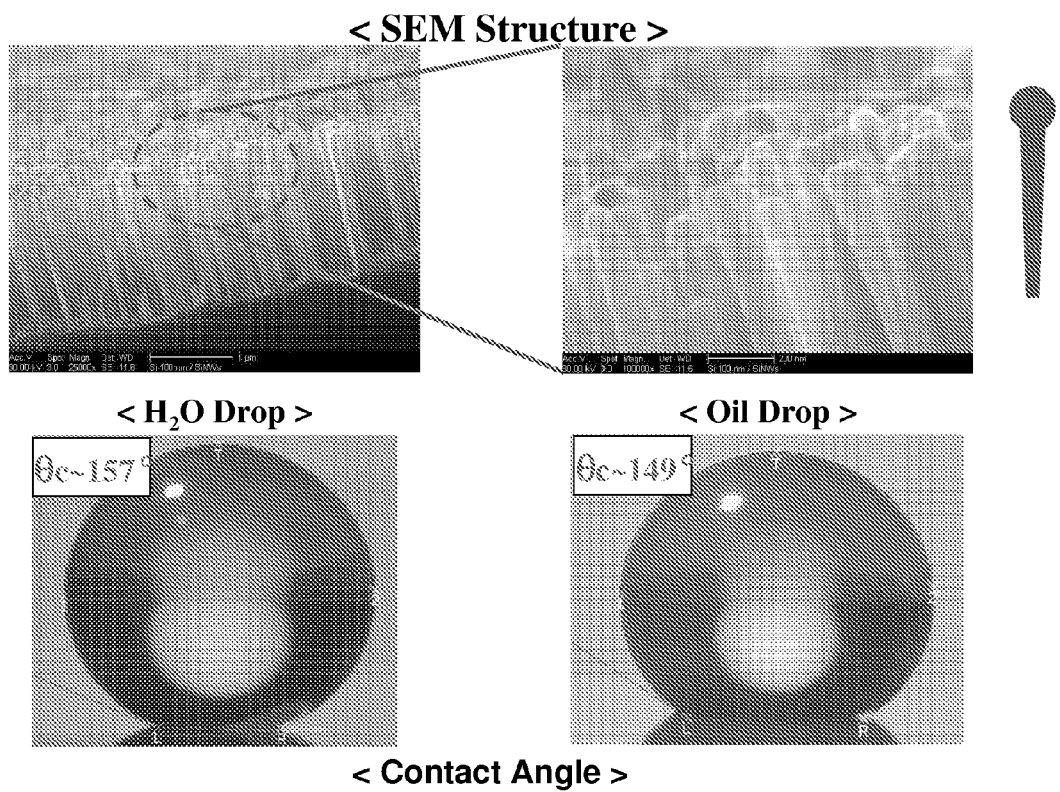
FIG. 18 shows wetting behavior of water and oil droplets on the Si nanowired surface of FIG. 16 that is modified by oblique incident deposition of about 100 nm thick Si film with silane coating.
Figure 19:
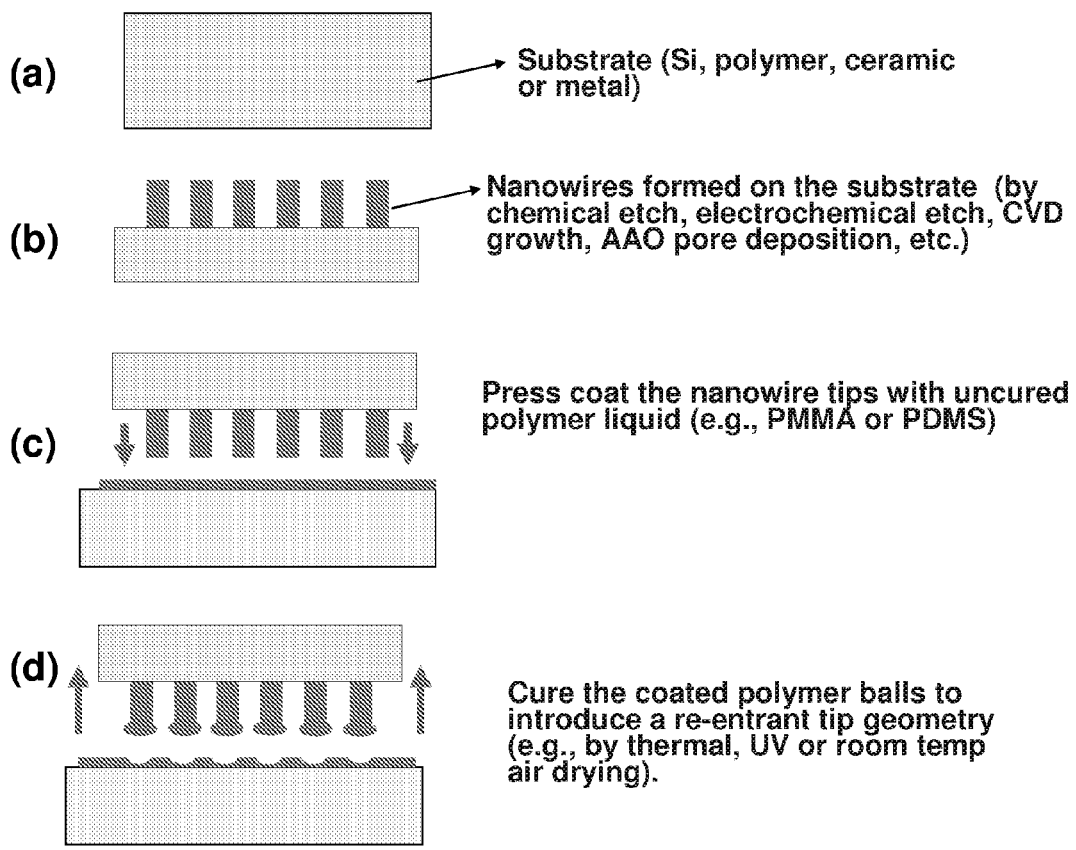

In FIG. 17, the top of the Si nanowire sample is sputter deposited with about 20 nm thick Si at an oblique incident angle of 30°. Compared to the original nanowire geometry shown in FIG. 16, the Si deposition can make the nanowire tips notably thicker and change their shape from needle like to re-entrant. This change in the Si nanowire tip geometry can substantially maintain the superhydrophobic properties of the Si nanowired surface (the contact angle against water droplet is slightly reduced to ~162°), but significantly improve the superoleophobic characteristics (the contact angle against oil drop is now increased to ~143°). In FIG. 18, the thickness of the oblique-incident sputtered Si material is increased to about 100 nm so that the Si nanowire tips are now in a mushroom-like shape, as illustrated in the schematic nanowire shape drawn on the right side of FIG. 18. Such a modification to the Si nanowire tips can still keep the nanostructured sample to remain highly superhydrophobic (the contact angle against water droplet drops slightly to ~157°), but considerably enhance the superoleophobic characteristics (the contact angle against oil drop rises to ~149°). The examples shown in FIGS. 17-18 use Si nanowires for illustration purpose. The same principles apply to other types of nanowires including metallic, ceramic or polymeric nanowires.

In various implementations, polymer-based superomniphobic surfaces can be fabricated by a number of different techniques. FIGS. 19(a)-19(d) schematically illustrate an exemplary process of fabricating polymer-based superomniphobic surfaces. In this fabrication process, Si or metallic, ceramic or polymeric nanowires can first be created on a Si or polymeric, ceramic or metallic substrate using any suitable means such as chemical etch, electrochemical etch, chemical vapor deposition growth, anodized aluminum oxide pore deposition, or the like. The tips of the nanowires can then be pressed into a polymer liquid so as to coat the nanowire tips with a small amount of the liquid polymer. In some embodiments, the liquid polymer can include PMMA. In some embodiments, the liquid polymer can include PDMS. The liquid polymer balls coated on the nanowire tips can then be hardened to introduce a re-entrant/mushroom tip geometry on the nanowire surface. In some embodiments, the liquid polymer can be hardened by thermal or UV curing. In some embodiments, the liquid polymer can be hardened by room temperature air drying.

In some implementations, polymer-based superomniphobic surfaces can be made by first spin coating a thin layer of PDMS on a flat substrate (e.g., Si), followed by contacting an array of PDMS nanowires (e.g., pre-fabricated by nano-imprinting) with the PDMS coating layer so as to form small PDMS drops at the nanowire tips. The PDMS drops can then be cured by heating or UV exposure to provide the PDMS nanowires with mushroom-like tip shape.

In some implementations, polymer-based superomniphobic surfaces can be made by sputter or evaporation coating of polymer or Teflon material, preferably at an oblique incident angle (or optionally at a vertical angle) onto pre-fabricated Si or metallic, ceramic, or polymeric nanowires, so as to selectively add more material near the tips of the nanowires. In some implementations, polymer-based superomniphobic surfaces can be made by brush coating or spray coating of polymer material on a nanowired surface so as to selectively add more material near the tip of Si, or metallic, ceramic, or polymeric nanowires. In some implementations, polymer-based superomniphobic surfaces can be made by first preparing a polymeric nanowire array and then adding a surface mask at the tips, on or near the top surface of the polymeric nanowires (e.g., with metal, ceramic, carbon or less soluble or non-soluble polymer by physical or chemical deposition). Chemical or RIE etch can then used to selectively (or preferentially) remove material from the unprotected nanowire sidewall rather than from the protected nanowire tips. After removing the mask material, a mushroom-like tip geometry can be formed on the nanowired surface.

In many applications, material surfaces may not be flat. Even if a material surface is supposed to be nominally flat, there may be surface roughness, steps, curvatures, and the like. To form a superomniphobic coating on a non-flat surface, a compliant stamp based on an elastomeric material can be used to accommodate the surface unevenness. FIGS. 20(a)-20(c) schematically illustrate an exemplary process of fabricating a superomniphobic coating on an uneven surface. In this fabrication process, Si or metallic, ceramic or polymeric nanowires can first be created on the non-flat surface using any suitable means such as chemical etch, electrochemical etch, chemical vapor deposition growth, anodized aluminum oxide pore deposition, or the like. A liquid polymer (e.g., PMMA or PDMS) can then be coated on the surface of a compliant stamp that is made of an elastomer. The compliant stamp can then be pressed onto the nanowired uneven surface, with the liquid polymer coating in contact with the nanowires. The compliance of the stamp may allow it to deform/deflect to conform to the uneven surface. As such, a small amount of the liquid polymer can be transferred onto the tips of the nanowires. The polymer balls covering the nanowire tips can then be hardened (e.g., by thermal or UV curing or room temperature air drying) to form a re-entrant/mushroom tip geometry over the nanowired uneven surface.

In various applications, non-flat devices can advantageously have internal and/or external surfaces that are superhydrophobic, superoleophobic and/or superomniphobic. For example, it may be desirable to impart bio-inert (e.g., superhydrophobic and/or superoleophobic) properties on the surface of electrical lead wires that are implanted for neural stimulations (such as pacemaker parts, brain stimulator parts) or on the surface of plastic protection tubes in which electrical wires are inserted. Over time natural body reactions and immune responses can cause adhesion and accumulation of body proteins, extra cellular matrix, and scar tissues on the external surfaces of the implanted devices, making those devices less functional both mechanically and electrically.

Another example of non-flat devices that may need superhydrophobic, superoleophobic and/or superomniphobic surface is the inside wall of tubular biomedical devices such as hearing aid and ear mold components. A superhydrophobic and/or superoleophobic internal surface can minimize the trapping of sweat, water, ear wax, and the like on such devices. Other examples of non-flat components that may superhydrophobic, superoleophobic and/or superomniphobic surface can include tubular-shaped connection parts for implanted devices such as fluid-transporting or fluid-draining tube connections, or implanted drug-delivery outlet tubes (for example, insulin pumps) that may become clogged over time as proteins and scar tissues accumulate.

FIGS. 21(a)-21(d) schematically illustrate an exemplary process of fabricating a superhydrophobic, superoleophobic and/or superomniphobic coating on a substrate that can be flat or non-flat. This fabrication process uses a wire as an example substrate. The process can be applied to any suitable substrates that may include wire, rod, mesh surface, inside wall of a tube and more and that can be made of metal, ceramic, carbon, polymer or the like. In this fabrication process, the surface of the wire substrate can first be covered with a liquid coating that contains nanoparticles of polymer, metal, ceramic, or the like. The liquid coating can then be dried or heated to form isolated islands of nanoparticles that are adhered on the wire surface as mask islands. Subsequent etching by chemical, electrochemical or RIE etching through the mask islands can produce an array of radially protruding nanowires that may be re-entrant with substantially equal diameters. The tips of the nanowires can be made more mushroom-like by utilizing the tip modification methods as described above.

FIGS. 22(a)-22(d) schematically illustrate another exemplary process of fabricating a superhydrophobic, superoleophobic and/or superomniphobic coating on a substrate that can be flat or non-flat. This fabrication process also uses a wire as an example substrate. The process can also be applied to any suitable substrates that may include wire, rod, mesh surface, inside wall of a tube and more and that can be made of metal, ceramic, carbon, polymer or the like. In this fabrication process, a semi-wettable coating that may be balled up later can be applied on the wire surface. One example of such a coating that can be balled up later may be a metallic coating (such as Ni, Ag, Cu sputter coated or evaporation coated film). Another example material that can be balled up may be an uncured polymer liquid coating (such as epoxy) that can be applied by, e.g., spray coating, dip coating or brush coating. In some embodiments, a sputtered or evaporated metal film can ball up into island arrays when the metal film is heated to a temperature of about 300-600° C. In some embodiments, a polymer liquid coating can ball up upon drying of solvent. In some implementations, an epoxy coating can ball up to form discrete islands without drying or heating. The balled-up islands can serve as etch-mask islands on subsequent chemical or electrochemical or RIE etching of the wire surface so as to form an array of nanowires that may have a re-entrant/mushroom tip shape.

FIGS. 23(a)-23(e) schematically illustrate yet another exemplary process of fabricating a superhydrophobic, superoleophobic and/or superomniphobic coating on a substrate that can be flat or non-flat. This fabrication process also uses a wire as an example substrate. The process can also be applied to any suitable substrates that may include wire, rod, mesh surface, inside wall of a tube and more and that can be made of metal, ceramic, carbon, polymer or the like. In this fabrication process, a two-phase decomposable polymer or metal can be used as an etch mask. In some embodiments, two immiscible metals can be co-sputtered on the wire surface followed by heating to decompose into two-phases. In some embodiments, a spinodally decomposing alloy (such as Cu—Ni—Fe) can be sputtered on the wire surface followed by aging to spinodally decompose into two phases. In some embodiments, a decomposable diblock copolymer (such as PMMA-polystyrene) can be coated on the wire surface followed by heating to decompose into two phases. After decomposition into a two-phase nanostructure, one of the two phases can be preferentially etched away by, e.g., acid or solvent to form an etch-mask island array. A surface nanowire structure that may have a re-entrant/mushroom tip geometry can then be formed upon subsequent masked etching of the wire surface by, e.g., chemical or electrochemical or RIE etching.

FIGS. 24(a) and 24(b) schematically illustrate still another exemplary process of fabricating a superhydrophobic, superoleophobic and/or superomniphobic coating on a substrate that can be flat or non-flat. This fabrication process uses a cylindrical substrate as an example. The process can be applied to any suitable substrates that may include wire, rod, mesh surface, inside wall of a tube and more and that can be made of metal, ceramic, carbon, polymer or the like. In some implementations (see, e.g., FIG. 24(a)), a conformable or stretchable mask sheet (e.g., made of a pre-hole-patterned rubber sheet) can be wrapped around the cylindrical substrate surface to provide a masked cover. Local etching and guided patterning through the holes on the mask sheet can produce nanowires on the substrate surface that may have a re-entrant/mushroom tip geometry. In some implementations (see, e.g., FIG. 24(b)), an elastomeric nano-imprint stamp with photoresist on the nano-imprint tips can be used for roll stamping transfer of the photoresist onto the cylindrical substrate surface to form a patterned etch mask. Local etching and guided patterning through the pattern on the mask can produce a nanowire array on the substrate surface that may be re-entrant or mushroom-like. In some implementations, a rod-like nano-implant stamp having photoresist on the nano-imprint tips can be inserted into a tube-shaped substrate and rotated while being pressed onto the inside wall of the tube to form a patterned etch mask on the inside surface of the tube. Local etching and guided patterning through the pattern on the mask can produce an array of nanowires on the inside tube surface that may have a re-entrant/mushroom tip shape.

FIGS. 25(a) and 25(b) schematically illustrate an exemplary process of forming a superhydrophobic, superoleophobic and/or superomniphobic surface on the inside wall of a tube-shaped substrate. In this process, a nanoscale polymer coating (e.g., PDMS or Teflon) or metal foil (e.g., Ni, Co, Au, Pt, Pd, W or their alloys) can first be fabricated (e.g., by nano-imprinting) on a flat substrate (FIG. 25(a)). The nanoscale polymer coating or metal foil can include nanowires that may have a re-entrant/mushroom tip geometry so as to impart the coating/foil surface with superhydrophobic, superoleophobic and/or superomniphobic characteristics. The polymer coating or metal foil can be peeled-off from the substrate and then rolled up into a cylindrical shape ((FIG. 25(b)). A thin adhesive layer can be applied on the outside diameter of the rolled-up cylinder, and the cylinder can then be attached onto the inside wall of the tube-shaped substrate (e.g., ear mold bore). In some embodiments, an expandable tool can be used to press the rolled-up cylinder outward so as to apply pressure on the adhesive layer to bond with the inside tube wall.

In some implementations, a superhydrophobic, superoleophobic and/or superomniphobic coating can be fabricated in-situ by first applying a thin coating of a liquid elastomer (e.g., PDMS) on the inside wall of a tube-shaped substrate (e.g., ear mold bore). An imprinting tool (e.g., two-piece, semi-cylindrical metal tool with outer surface pre-patterned as an imprint stamp) can then be inserted into the tube to radially imprint the polymer coating. The radially imprinted polymer coating can be cured with the imprinting tool still in place. Subsequent removal of the imprinting tool can leave cured polymer nanowires that may be re-entrant or mushroom like on the inside surface of the tube-shaped substrate. The radial imprinting tool can be equipped with electric heating elements so as to heat the polymer coating for curing. This may advantageously eliminate the need to subject the whole substrate to curing at a high temperature (e.g., 60-120° C.).

In some embodiments, the superhydrophobic, superoleophobic and/or superomniphobic coatings described herein can include an array of spacers in a nanowire coating to enhance the durability of the coating. For example, an array of larger dimensioned, flat topped protective spacers can be added to a nanowire coating to withhold compressive and/or shear stresses, thereby making the nanostructured coating last longer. Such a spacer can have a lateral dimension greater than the lateral dimension of a nanowire and can have a height that is equal or different from that of the nanowires. As illustrated in three examples of different shapes of the nanowires with flat tips, sharpened or tapered tips and mushroom like caps on nanowire tips in FIGS. 26($a$)-26($c$), such spacers can be a periodic array that are distributed sporadically amongst the nanowires so that multiple nanowires are located between two adjacent spacers. In some implementations, the height of the spacer array can be about 5-30% larger than the thickness of the nanowired coating. The spacer can be made of the same material as the substrate, or can be made of one or more stronger materials such as ceramic or silica or metal. The spacer islands can be of any suitable shape such as circular, square, rectangular or random shape. In some implementations, the diameter of each spacer island can be about 1-100 micrometer. In some implementations, the spacer array can occupy about 1-20% of the surface area of the coating. The spacers can be deposited by any suitable processes such as imprinting, nano-imprinting, screen printing, sputter deposition through shadow mask, or photolithographic patterning, and the like.

The superhydrophobic, superoleophobic and/or superomniphobic coatings described herein can be well adherent and made with low cost. Using the $Al_2O_3$-based coating nanostructures described herein as an example, aluminum can be quite adherent on glass (as it is often used as metallization for mirrors); the anodization processing can be done at room temperature, and large area, parallel anodization processing of many glass sheets may be performed.

The nanoscale superhydrophobic, superoleophobic and/or superomniphobic surface coating structures and materials described herein can have many potential applications. For example, the nanostructured coatings described herein may be used on self-cleaning glass panels and windows for homes, exterior of homes and buildings (e.g., brickwall, stonewall, concrete wall), high-rise building windows. Washing/cleaning of building windows or exterior can be a hassle that may cause waste of water and induce environmental pollution if cleaned with chemicals. Self-cleaning coatings on housing windows and exterior which may no longer need the use of washing water can be one of the approaches to reducing water consumption via clean technology. The nanostructured coatings described herein can also prevent or minimize water, rain and/or snow related dirt accumulation, as well as organic stuff in the air sticking/adhering to the surface, so less frequent or no cleaning may be needed.

The nanostructured coatings described herein may also be used for UV filtering windows, tinted glasses, one-way see-through type special windows.

The nanostructured coatings described herein may further be used on airplane cockpit windows. During flight, many substances, rain, snow may make the cockpit outside window dirty, which cannot be cleaned with windshield wipers and sprinkled water at high altitudes with freezing temperature. Transparent surface coatings that are superhydrophobic and/or superoleophobic can prevent rain, snow and other substances from sticking onto the window for maintenance-free, safe navigation of the airplanes. The superhydrophobic Si nanowire surfaces and the superhydrophobic $Al_2O_3$ nanowire surfaces described herein can be well suitable for such applications since ice doesn't stick to those nanowired surfaces even at a temperature below $-10°$ C.

The nanostructured coatings described herein may be used on aircraft wings. Accumulation of ice and snow on aircraft wings can cause some main airplane accidents. Very superhydrophobic surface coatings can keep these surfaces clean, thus preventing or minimizing accumulation of snow and ice for safer operation of commercial jet aircrafts. Airplane body and wings are often made of aluminum-containing alloys such as duralumin (e.g., ~93.5% Al—4.4% Cu—1.5% Mg and other alloying elements). These airplane materials can be suitable to form aluminum oxide nanowire covered surface. The anodization processing for forming aluminum oxide nanowires on the airplane wing surface and other processes for forming superhydrophobic and/or superoleophobic coatings may help reduce flight delays and tragic accidents caused by snow/ice accumulation on the airplane wings.

The nanostructured coatings described herein may also be used for self-cleaning toilet bowls, kitchen cookwares/pots that may need no or at least less frequent washing/cleaning. This can lead to environmental cleantech products with less need to use ammonia type chemical cleaners.

The nanostructured coatings described herein may further be used on no-wash automobiles (e.g., as a coating on windshield or painted surface) to reduce water consumption and car-wash-related environmental contaminations. For instance, application of superhydrophobic and/or superoleophobic surface coatings to automobile bodies can prevent rain, snow and other substances from sticking onto the car body exterior surfaces for cleaning-free operations, thus leading to water conservation and reduced pollution from washing chemicals/detergents.

The nanostructured coatings described herein may be used on safety telecommunication antennas and satellites. Minimizing snow or ice accumulations on telecommunication antennas and satellite surfaces can help to provide safer and more reliable operations of such devices and systems. The superhydrophobic Si nanowire surfaces and the superhydrophobic $Al_2O_3$ nanowire surfaces described herein can be well suitable for such applications since ice doesn't stick to those nanowired surfaces even at a temperature below $-10°$ C.

The nanostructured coatings described herein may also be used in water/oil or water/oil-containing liquid transport such as pipeline inner-surface coating to minimize oil or water fluid drag to enhance pipeline lifetime, reduce need for replacements, minimize contamination and conserve energy.

For instance, if the interior surface of pipelines (e.g., pipelines for oil transport, factory transport of fluids, drinking water transport) is made superhydrophobic and superoleophobic and thus tends to repel water/oil, there can be less drag force for liquid transport through the pipe and the wear/tear of the pipe may be much reduced.

The nanostructured coatings described herein may further be used in many biomedical implant applications that would have to deal with scar tissues grabbing and covering up the implants, protein adhesion and blockage of tubes, drug-release paths, electrical wiring, and the like. Superhydrophobic and/or superoleophobic surfaces can minimize fouling of implanted devices such as stents and various other surfaces of implants and human-touching devices by reducing the adherence of water-based liquid and/or oil-based liquid.

The nanostructured coatings described herein may be used on boats, yachts, and ship bottoms where sea shells, fungi, sea weeds, and other proteins may stick and cause fouling, drag for speedy movement, and the like. Superhydrophobic and/or superoleophobic coatings can make the boats, yachts or ships last longer before cleaning.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method of making an article, comprising:
   forming a metal coating on a glass substrate;
   annealing the metal coating to form balled-up metal islands;
   coating over the balled-up metal islands with a protective layer including sputter deposition of Ti/Au over the balled-up metal islands while leaving corner regions between the balled-up metal islands and the glass substrate open to chemical etching to selectively protect at least a portion of the balled up metal islands and at least a portion of the glass substrate from etching; and
   etching the glass substrate using the balled-up metal islands as a mask to form a plurality of glass nanowires to provide the article having a contact angle with water droplet that is greater than about 140 degrees.

2. The method of claim 1, wherein the metal comprises silver (Ag).

3. The method of claim 1, wherein the glass substrate is etched using reactive ion etch.

4. The method of claim 1, wherein the glass substrate is etched with a chemical etchant after the protective layer is coated onto the glass substrate having the balled-up metal islands.

5. The method of claim 1 further comprising removing the balled-up metal islands after the plurality of glass nanowires are formed.

6. The method of claim 1, wherein the protective layer is coated over the balled-up metal islands and exposed substrate while leaving a corner region between the balled-up islands and the exposed glass surface open to etching.

7. The method of claim 1, comprising removing the balled up islands with the protective layer to expose the plurality of glass nanowires.

8. The method of claim 1, wherein the protective layer includes Ti and Au materials.

9. A method of making an article, comprising:
   coating a layer of metal or polymer on a substrate;
   annealing the metal or polymer layer to form balled-up metal or polymer islands; and
   etching the substrate using the balled-up metal or polymer islands as a mask to form a plurality of nanowires having a re-entrant or mushroom tip geometry in the substrate;
   etching away the mask from the substrate to obtain substantially mask-free substrate that maintains the re-entrant or mushroom tip geometry, wherein the re-entrant or mushroom tip geometry is shaped to have more material near the tip of the nanowires.

10. The method of claim 9, comprising removing the balled-up metal or polymer islands to provide the article having a contact angle with water droplet and a contact angle with oil droplet that both are greater than about 140 degrees.

11. The method of claim 9, wherein the substrate comprises a non-flat substrate.

12. The method of claim 9, wherein the substrate comprises a wire.

13. The method of claim 9, wherein the substrate comprises an inside wall of a tube.

14. The method of claim 9, comprising:
    selectively depositing a polymer material at tips of the nanowires to add more material to the re-entrant or mushroom tip geometry,
    wherein the selectively depositing the polymer material includes sputter or evaporation coating of the polymer material.

15. The method of claim 9, comprising:
    selectively depositing a polymer material at tips of the nanowires to add more material to the re-entrant or mushroom tip geometry,
    wherein the selectively depositing the polymer material includes brush coating or spray coating of the polymer material.

16. The method of claim 15, wherein:
    the polymer material selectively deposited at the tips of nanowires include Si.

* * * * *